US009666456B2

(12) United States Patent
Collins et al.

(10) Patent No.: US 9,666,456 B2
(45) Date of Patent: May 30, 2017

(54) METHOD AND APPARATUS FOR TREATING A WORKPIECE WITH ARRAYS OF NOZZLES

(71) Applicant: TEL FSI, Inc., Chaska, MN (US)

(72) Inventors: Jimmy D. Collins, Allen, TX (US); David P. DeKraker, Burnsville, MN (US); Tracy A. Gast, Waconia, MN (US); Alan D. Rose, Wylie, TX (US)

(73) Assignee: TEL FSI, INC., Chaska, MN (US)

( * ) Notice: Subject to any disclaimer, the term of this patent is extended or adjusted under 35 U.S.C. 154(b) by 0 days.

(21) Appl. No.: 14/635,826

(22) Filed: Mar. 2, 2015

(65) Prior Publication Data

US 2015/0170941 A1    Jun. 18, 2015

Related U.S. Application Data

(62) Division of application No. 13/649,742, filed on Oct. 11, 2012, now Pat. No. 8,978,675, which is a division of application No. 11/820,709, filed on Jun. 20, 2007, now Pat. No. 8,387,635.

(60) Provisional application No. 60/819,133, filed on Jul. 7, 2006.

(51) Int. Cl.
*H01L 21/67* (2006.01)
(52) U.S. Cl.
CPC .............................. *H01L 21/67051* (2013.01)
(58) Field of Classification Search
CPC ................................................ H01L 21/67051
See application file for complete search history.

(56) References Cited

U.S. PATENT DOCUMENTS

| | | | |
|---|---|---|---|
| 3,836,329 | A | 9/1974 | Jordan |
| 3,990,462 | A | 11/1976 | Elftmann et al. |
| 4,544,446 | A | 10/1985 | Cady |
| 4,609,575 | A | 9/1986 | Burkman |
| 4,639,270 | A | 1/1987 | Ando et al. |
| 4,682,615 | A | 7/1987 | Burkman et al. |
| 4,801,335 | A | 1/1989 | Burkman et al. |
| 4,903,717 | A | 2/1990 | Sumnitsch |
| 5,020,323 | A | 6/1991 | Hürlimann |
| 5,246,526 | A | 9/1993 | Yamaguchi et al. |
| 5,271,774 | A | 12/1993 | Leenaars et al. |
| 5,395,649 | A | 3/1995 | Ikeda |
| 5,453,132 | A | 9/1995 | Kowalchuk |
| 5,472,502 | A | 12/1995 | Batchelder |
| 5,513,668 | A | 5/1996 | Sumnitsch |
| 5,571,560 | A | 11/1996 | Lin |
| 5,688,322 | A | 11/1997 | Motoda et al. |

(Continued)

FOREIGN PATENT DOCUMENTS

| | | |
|---|---|---|
| CN | 1471150 A | 1/2004 |
| CN | 1 723 542 | 1/2006 |

(Continued)

OTHER PUBLICATIONS

Lim, Jung-Soo, "The 6th Surface Cleaning Users Group Meeting, Cleaning Technology Symposium," handout, Sep. 19, 2007 (9 pages).

(Continued)

*Primary Examiner* — Jason Ko
(74) *Attorney, Agent, or Firm* — Kagan Binder, PLLC

(57) ABSTRACT

The present invention provides a tool for treating microelectronic workpieces with one or more treatment materials, including liquids, gases, fluidized solids, dispersions, combinations of these, and the like.

11 Claims, 32 Drawing Sheets

(56) References Cited

U.S. PATENT DOCUMENTS

| | | |
|---|---|---|
| 5,765,072 A | 6/1998 | Ohtani et al. |
| 5,783,025 A | 7/1998 | Hwang et al. |
| 5,785,068 A | 7/1998 | Sasaki et al. |
| 5,873,380 A | 2/1999 | Kanno |
| 5,900,059 A | 5/1999 | Shimanuki et al. |
| 5,916,366 A | 6/1999 | Ueyama et al. |
| 5,927,303 A | 7/1999 | Miya et al. |
| 5,976,256 A | 11/1999 | Kawano |
| 6,048,409 A | 4/2000 | Kanno et al. |
| 6,051,371 A | 4/2000 | Mita et al. |
| 6,065,424 A | 5/2000 | Shacham-Diamand et al. |
| 6,069,333 A | 5/2000 | Morlock |
| 6,090,205 A | 7/2000 | Sakai et al. |
| 6,096,233 A | 8/2000 | Taniyama et al. |
| 6,129,546 A | 10/2000 | Sada |
| 6,139,636 A | 10/2000 | Huang et al. |
| 6,149,759 A | 11/2000 | Guggenberger |
| 6,193,798 B1 | 2/2001 | Sumnitsch |
| 6,221,781 B1 | 4/2001 | Siefering et al. |
| 6,230,722 B1 | 5/2001 | Mitsumori et al. |
| 6,239,038 B1 | 5/2001 | Wen |
| 6,243,966 B1 | 6/2001 | Lubomirsky et al. |
| 6,247,479 B1 | 6/2001 | Taniyama et al. |
| 6,260,562 B1 | 7/2001 | Morinishi et al. |
| 6,273,104 B1 | 8/2001 | Shinbara et al. |
| 6,299,804 B1 | 10/2001 | Domodossola et al. |
| 6,332,470 B1 | 12/2001 | Fishkin et al. |
| 6,385,863 B1 | 5/2002 | Kruwinus |
| 6,398,975 B1 | 6/2002 | Mertens et al. |
| 6,431,184 B1 | 8/2002 | Taniyama |
| 6,435,200 B1 | 8/2002 | Langen |
| 6,473,933 B1 | 11/2002 | Paterson et al. |
| 6,488,040 B1 | 12/2002 | de Larios et al. |
| 6,491,764 B2 | 12/2002 | Mertens et al. |
| 6,494,221 B1 | 12/2002 | Sellmer et al. |
| 6,536,454 B2 | 3/2003 | Lindner |
| 6,589,338 B1 | 7/2003 | Nakamori et al. |
| 6,589,361 B2 | 7/2003 | Luscher et al. |
| 6,594,847 B1 | 7/2003 | Krusell et al. |
| 6,672,318 B1 | 1/2004 | Tsuchiya et al. |
| 6,680,253 B2 | 1/2004 | Wirth et al. |
| 6,688,784 B1 | 2/2004 | Templeton |
| 6,694,224 B2 | 2/2004 | Ramanan |
| 6,705,331 B2 | 3/2004 | Sato et al. |
| 6,737,104 B2 | 5/2004 | Suzuki et al. |
| 6,776,359 B2 | 8/2004 | Cole et al. |
| 6,810,888 B2 | 11/2004 | Tsuchiya et al. |
| 6,826,910 B1 | 12/2004 | Easton |
| 6,834,440 B2 | 12/2004 | Lee |
| 6,863,229 B1 | 3/2005 | Leisi |
| 6,874,516 B2 | 4/2005 | Matsuno et al. |
| 6,896,466 B2 | 5/2005 | Nishimura et al. |
| 6,901,938 B2 | 6/2005 | Sato et al. |
| 6,913,651 B2 | 7/2005 | Ivanov et al. |
| 6,939,807 B2 | 9/2005 | Yun et al. |
| 7,022,193 B2 | 4/2006 | Jeong et al. |
| 7,051,743 B2 | 5/2006 | Kim et al. |
| 7,089,076 B2 | 8/2006 | Geismar et al. |
| 7,171,973 B2 | 2/2007 | Orii et al. |
| 7,275,553 B2 | 10/2007 | Orii et al. |
| 7,306,002 B2 | 12/2007 | Kim et al. |
| 7,309,847 B2 | 12/2007 | Cao |
| 7,323,080 B2 | 1/2008 | Kim et al. |
| 7,332,055 B2 | 2/2008 | Orii et al. |
| 7,364,625 B2 | 4/2008 | Christenson et al. |
| 7,383,843 B2 | 6/2008 | Ravkin et al. |
| 7,387,131 B2 | 6/2008 | Kuroda et al. |
| 7,389,783 B2 | 6/2008 | Woods et al. |
| 7,390,365 B2 | 6/2008 | Itoh et al. |
| 7,404,407 B2 | 7/2008 | Orii et al. |
| 7,422,641 B2 | 9/2008 | Nakajima et al. |
| 7,436,486 B2 | 10/2008 | Hirukawa |
| 7,476,616 B2 | 1/2009 | Christenson |
| 7,531,039 B2 | 5/2009 | Sato et al. |
| 7,543,593 B2 | 6/2009 | Orii et al. |
| 7,584,760 B2 | 9/2009 | Miya et al. |
| 7,639,343 B2 | 12/2009 | Hirukawa |
| 7,681,581 B2 | 3/2010 | Rose et al. |
| 7,712,475 B2 | 5/2010 | Fukuda et al. |
| 7,827,930 B2 | 11/2010 | Lubomirsky et al. |
| 7,913,706 B2 | 3/2011 | DeKraker et al. |
| 2002/0029788 A1 | 3/2002 | Verhaverbeke et al. |
| 2002/0063169 A1 | 5/2002 | Verhaverbeke et al. |
| 2003/0051366 A1 | 3/2003 | Ise et al. |
| 2003/0070695 A1 | 4/2003 | Emami et al. |
| 2003/0084925 A1 | 5/2003 | Nakajima et al. |
| 2003/0155325 A1 | 8/2003 | Mansour et al. |
| 2003/0170988 A1 | 9/2003 | Izumi et al. |
| 2003/0226577 A1 | 12/2003 | Orll et al. |
| 2004/0003778 A1 | 1/2004 | Hayashi |
| 2004/0062874 A1 | 4/2004 | Kim et al. |
| 2004/0123484 A1 | 7/2004 | Yoshikawa et al. |
| 2004/0206375 A1 | 10/2004 | Ho et al. |
| 2004/0226655 A1 | 11/2004 | Kajino et al. |
| 2004/0261817 A1 | 12/2004 | Araki et al. |
| 2005/0183750 A1 | 8/2005 | Matsuno et al. |
| 2005/0244579 A1 | 11/2005 | Matsuzawa et al. |
| 2005/0268856 A1 | 12/2005 | Miller et al. |
| 2006/0060136 A1 | 3/2006 | Kisakibaru et al. |
| 2006/0219258 A1 | 10/2006 | Gast |
| 2006/0260647 A1 | 11/2006 | Verhaverbeke et al. |
| 2007/0105380 A1 | 5/2007 | Orii et al. |
| 2007/0227566 A1 | 10/2007 | Miya |
| 2007/0245954 A1 | 10/2007 | Collins et al. |
| 2008/0006303 A1 | 1/2008 | Butterbaugh et al. |
| 2008/0008834 A1 | 1/2008 | Collins et al. |
| 2008/0210278 A1 | 9/2008 | Orii et al. |
| 2008/0213076 A1 | 9/2008 | Hanson et al. |
| 2008/0271763 A1 | 11/2008 | Collins et al. |
| 2008/0283090 A1 | 11/2008 | DeKraker et al. |
| 2009/0015807 A1 | 1/2009 | Hirukawa et al. |
| 2009/0280235 A1 | 11/2009 | Lauerhaas et al. |
| 2011/0308647 A1 | 12/2011 | Collins et al. |
| 2012/0272893 A1 | 11/2012 | Lauerhaas et al. |
| 2013/0032172 A1 | 2/2013 | Collins et al. |
| 2013/0032182 A1 | 2/2013 | Collins et al. |
| 2013/0037511 A1 | 2/2013 | Collins et al. |
| 2013/0213485 A1 | 8/2013 | Lauerhaas et al. |
| 2015/0075569 A1 | 3/2015 | Collins et al. |

FOREIGN PATENT DOCUMENTS

| | | |
|---|---|---|
| EP | 0992628 | 4/2000 |
| EP | 1 204 139 | 5/2002 |
| EP | 1 335 412 | 8/2003 |
| EP | 1 708 252 | 10/2006 |
| FR | 2 747 117 | 10/1997 |
| JP | 60 5530 | 1/1985 |
| JP | 61-1699 | 8/1986 |
| JP | 63 73626 | 4/1988 |
| JP | 8 139065 | 5/1996 |
| JP | 2555034 | 11/1996 |
| JP | 09 314019 | 12/1997 |
| JP | 10 163154 | 6/1998 |
| JP | 10-199852 | 7/1998 |
| JP | 11-008213 | 1/1999 |
| JP | 11054472 | 2/1999 |
| JP | 11-087294 | 3/1999 |
| JP | 2000 124181 | 4/2000 |
| JP | 2001 015481 | 1/2001 |
| JP | 2001-189260 | 7/2001 |
| JP | 2001 267278 | 9/2001 |
| JP | 2002 246358 | 8/2002 |
| JP | 2002 343711 | 11/2002 |
| JP | 2002-359220 | 12/2002 |
| JP | 2003 109935 | 4/2003 |
| JP | 2004 31400 | 1/2004 |
| JP | 2004 153078 | 5/2004 |
| JP | 2004-265911 | 9/2004 |
| JP | 2004 265911 | 9/2004 |
| JP | 2004-265912 | 9/2004 |
| JP | 2005 039205 | 2/2005 |
| JP | 2005-167089 | 6/2005 |
| JP | 2005 235945 | 9/2005 |

(56) References Cited

FOREIGN PATENT DOCUMENTS

| | | |
|---|---|---|
| JP | 2005-311355 | 11/2005 |
| JP | 2005-340381 | 12/2005 |
| JP | 2005-353739 | 12/2005 |
| JP | 2006-5315 | 1/2006 |
| JP | 2006 80403 | 3/2006 |
| JP | 2006-086474 | 3/2006 |
| TW | 406216 | 9/2000 |
| WO | WO 02/04134 | 1/2002 |
| WO | WO 03/030228 | 4/2003 |
| WO | WO 2004/001828 | 12/2003 |
| WO | WO 2004/070807 | 8/2004 |
| WO | WO 2004/093166 | 10/2004 |
| WO | WO 2004/094702 | 11/2004 |
| WO | WO 2006/107549 | 10/2006 |
| WO | WO 2006/107550 | 10/2006 |
| WO | WO 2008/029848 | 3/2008 |

OTHER PUBLICATIONS

Adjustable Flow Air Amplifiers, http://www.airtxinternational.com/catalog/air_amplifiers.php?gclid=CMHsm_ix55ICFQE . . . (3 pages).

Air Amplifier—Nex Flow™, http://www.process-controls.com/techsales/Nex_Flow/air_amplifier.htm (3 pages).

METHOD AND APPARATUS FOR TREATING A WORKPIECE WITH ARRAYS OF NOZZLES

PRIORITY CLAIM

This application is a divisional of U.S. patent application Ser. No. 13/649,742, filed Oct. 11, 2012, which is a divisional of U.S. patent application Ser. No. 11/820,709, filed Jun. 20, 2007, wherein the respective entirety of each of said nonprovisional applications is incorporated herein by reference and wherein U.S. patent application Ser. No. 11/820,709 claims priority under 35 USC §119(e) from U.S. Provisional Patent Application having Ser. No. 60/819,133, filed on Jul. 7, 2006, wherein the respective entirety of said provisional patent application is incorporated herein by reference.

FIELD OF THE INVENTION

The present invention relates to barrier plates and dispense assemblies for tools used to process microelectronic substrates with one or more treatment fluids, including liquids and gases. More particularly, the present invention relates to such tools that include barrier plates and dispense assemblies with improved fluid flow, fluid containment, thermal accommodation, and/or drying capabilities.

BACKGROUND OF THE INVENTION

The microelectronic industry relies on a variety of different processes to manufacture microelectronic devices. Many processes involve a sequence of treatments in which different kinds of treatment fluids are caused to contact the workpiece in accordance with desired recipes. These fluids may be liquids, gases, or combinations thereof. In some treatments, solids may be suspended or dissolved in a liquid or entrained in a gas. It is highly desirable to capture and recover these treatment fluids for a variety of reasons including proper disposal, recycling, fume containment, process monitoring, process control, or other handling.

One capture technique involves using appropriately positioned ducts to capture treatment fluids. For instance, a typical manufacturing tool in the microelectronics industry involves supporting one or more workpieces in a processing chamber on a suitable support, such as a stationary platen, rotating turntable, or rotatable chuck. One or more ducts are positioned at least partially around the outer periphery of the support. As a treatment fluid is introduced into the processing chamber, an exhaust can be used to help pull the treatment fluid into the one or more ducts. With respect to rotating supports, centrifugal force causes fluids on a spinning workpiece and/or support surface to flow radially outward from the spin axis and into the duct(s).

Conventionally, a tool may include a single duct to capture different treatment fluids. However, using a single duct like this is not desirable in all instances. For example, some treatment fluids may be too reactive in the presence of other treatment materials. Other times, it may be desirable to capture different fluids using different capture conditions. Still other times, such as when recycling is desired, it may be desirable to capture a fluid in a dedicated duct to avoid contamination with other fluids.

Accordingly, tools containing multiple, stacked ducts, fixed relative to each other, have been used. Either the workpiece support and/or the stacked ducts themselves are raised and lowered in order to bring the appropriate duct into position. This conventional approach suffers from serious drawbacks. The stacked ducts make high-density tool packaging more difficult. The different ducts may also be subject to cross-contamination because they are always open to the workpiece and/or exhaust levels are not individually controlled. Some conventional duct systems also may not have the capability to separate the liquid and gas constituents of an exhaust stream. In some tools in which the duct structures themselves are moveable, drain and exhaust connections to external plumbing must also move, thereby adding undue complexity to tool design, manufacture, use, and service.

An innovative tool incorporating a flexible duct system is described in Assignee's co-pending U.S. Patent Publication No. US-2007/0022948-A1 (hereinafter referred to as the Co-Pending Application No. 1); as well as in Assignee's co-pending U.S. patent application Ser. No. 11/376,996, titled BARRIER STRUCTURE AND NOZZLE DEVICE FOR USE IN TOOLS USED TO PROCESS MICROELECTRONIC WORKPIECES WITH ONE OR MORE TREATMENT FLUIDS, in the names of Collins et al., filed Mar. 15, 2006, (hereinafter referred to as the Co-Pending Application No. 2). The entireties of these co-pending U.S. Patent Applications are incorporated herein by reference for all purposes. The "processing section 11" of the co-pending U.S. Patent Applications advantageously includes nested duct features that allow one or more duct pathways to be selectively opened and closed. For example, when the structures are moved apart relatively, a duct pathway opens and is enlarged between the structures. When the structures are moved together relatively, the duct between the structures is choked and is reduced in size. In preferred embodiments, multiple ducts can exist in the same volume of space depending upon how the moveable duct structures are positioned. Thus, multiple ducts can occupy a volume minimally larger than the volume occupied by only a single duct. The ducts are used to capture various treatment fluids, including liquid and/or gases, for recycling, discarding, or other handling. Different treatment fluids can be recovered in different, independent ducts to minimize cross-contamination and/or to use unique capture protocols for different fluids. Because of the nested character of the duct structures, the duct system also is extremely compact.

These co-pending U.S. Patent Applications also describe an innovative spray nozzle/barrier structure. This structure includes capabilities for dispensing treatment materials in multiple ways such as by a spray, a center dispense, and a showerhead. The barrier structure overlies the underlying workpiece. The lower surface of the barrier structure is shaped so that it defines a tapering flow channel over the workpiece. This approach offers many benefits. The tapering flow channel helps to promote radial flow outward from the center of the workpiece while minimizing recirculation zones. The taper also helps to smoothly converge and increase the velocity of flowing fluids approaching the outer edge of the workpiece. This helps to reduce liquid splash effects. The angle of the lower surface also helps liquid on the lower surface to drain toward the outer periphery. The tapering configuration also helps to reduce recirculation of particles back onto the workpiece. The configuration also helps facilitate chemical reclaim efficiency by better containment of fluids.

Notwithstanding all these benefits, further improvements are still desired. Firstly, during the course of treating a workpiece, the lower surface of the barrier structure may bear drops or films of liquid(s) used during the treatment. It would be desirable to find a way to effectively clean and/or dry the lower surface of the barrier structure quickly without an undue impact upon cycle time.

As another issue, it has been observed that the central region of workpieces tends to be processed to a lesser degree when treated with a spray bar that spans generally only a radius of the underlying workpiece. Yet, using a radius-spanning spray bar rather than a full diameter spray bar is desirable for ease of manufacturing or when a stream dispense is desired near the center of the workpiece. Thus, it would be desirable to improve the processing uniformity of radial spray bars.

Also the previously known barrier structure incorporates a spray bar mechanism as an integral member. The integrated component has a relatively large thermal mass. When heated materials are dispensed through the spray bar mechanism, the heat sink effect of the large thermal mass of the integrated components can cool the materials being dispensed and affect the temperature uniformity of the materials contacting the workpiece. This can impact the treatment performance in an undesirable way. Thus, there is a need to minimize this undesired thermal impact.

Additionally, there is an issue concerning mist containment in the process chamber. The center area of the barrier structure is generally open, even during a treatment. The center area allows air flow and functions much like a chimney through which plumbing components and the like are led to the dispensing components. During treatments, particularly spray treatments, some dispensed materials may have a tendency to escape upward through the chimney. It would be very desirable to contain the materials in the process chamber while still leaving an air flow path open.

SUMMARY OF THE INVENTION

The present invention provides a tool for treating microelectronic workpieces with one or more treatment materials, including liquids, gases, fluidized solids, dispersions, combinations of these, and the like. The invention provides an approach for rapid, efficient rinsing and/or drying of wetted surfaces, and is particularly advantageous when used to dry the lower surface of moveable barrier structures such as a barrier plate that overlies a workpiece being treated in such a manner to define a tapering flow channel over the workpiece. In representative embodiments, the lower surface of the barrier structure is provided with features (including grooves or other depressions in the surface or rims, tabs or other protuberances from the surface) that help to collect and/or contain liquid on the lower surface. Aspirating and/or wicking techniques are then used to remove the collected or contained liquid, e.g., to help dry the surface. The technique is fast and efficient, particularly when used in combination with drying gases or the like that are caused to contact the same surface. The aspirated fluid can be withdrawn in a variety of ways. For example, the aspiration inlet can be located on the lower surface of the barrier structure, on an outer edge, or on a separate component placed in fluid communication with the barrier structure.

The present invention also provides strategies to minimize thermal effects between a spraying mechanism and a barrier plate. Whereas Assignee's Co-Pending Applications Nos. 1 and 2 describe an apparatus in which the spraying mechanism and the barrier plate are a single, integrated, relatively large thermal mass component, some aspects of the invention involve providing these as separate components. The relatively low thermal mass spraying mechanism will heat more quickly and more uniformly. In other words, the degree to which the barrier plate functions as a heat sink for the spray bar is minimized. Providing the spraying mechanism and barrier structure as separate components allows each component to be independently fabricated from more purpose-suitable materials. Recognizing that different materials may have different rates of thermal expansion, preferred aspects of the invention couple the spraying mechanism to the barrier plate in a manner that helps accommodate differences in the rates of thermal expansion between these components.

The present invention also provides a simple, easily implemented way to help contain mists in a process chamber so that sprayed material has a dramatically reduced tendency to escape from an opening in the process chamber. In representative embodiments, a venturi shaped pathway is placed upstream or downstream from the open aperture. Material is easily contained in the process chamber due to the pressure drop resulting when a gas stream is caused to flow through the venturi and into the process chamber. Since make up gas, inert gas, carrier gas, and/or the like, are widely used in the course of treatments, this approach is compatible with many different kinds of treatments.

The present invention also provides a way to help ensure that the central region of a workpiece receives an appropriate treatment when a radius-type spray mechanism is used to spray treatment materials onto the workpiece. It has been observed that the nozzle footprint through which a spray is created may not match the on-workpiece footprint of the spray when the spray reaches the workpiece. The on-workpiece footprint is smaller than would be expected. Specifically, when liquid is atomized with a gas using a spraying mechanism such as spray bar 178, the on-workpiece footprint of the spray is smaller than the span of the nozzle array(s) from which the sprayed materials were dispensed. Thus, if the footprint of the nozzle openings merely span from the workpiece center to the outer periphery, the resultant spray may not actually effectively reach the center or the outer periphery, depending on spin speeds, exhaust flow rates, spraybar height above the workpiece, and/or the like. The high velocity of the dispensed gas develops a lower pressure region believed to be due to a Bernoulli effect. The portions of the spray array at the ends of the spray get drawn inward as shown in FIGS. 20*a* through 20*c*, described further below.

Consequently, at least some material aimed toward the workpiece center does reach the center but rather impacts the workpiece more toward the periphery. Because the workpiece typically is spinning during most treatments, and because the spinning causes material to flow generally radially outward across the workpiece surface, the result is that the workpiece center sees less treatment material than is desired. Processing there will tend to fall short of expectations as a result.

For instance, according to one example, less etching might occur in the center when an etching treatment is carried out. As another example, less particle removal efficiency may be observed in a particle removal process. The present invention significantly recognizes and accounts for this effect when configuring a radius-type spray bar so that the dispensed spray, even if it shrinks due to a Bernoulli effect, will still have a sufficient span to effectively treat the entirety of the workpiece surface in a more uniform manner.

In one aspect, the present invention provides an apparatus for processing a microelectronic workpiece that includes a processing chamber in which the workpiece is positioned during a treatment, a barrier structure including a lower surface that overlies and at least partially covers the workpiece during the treatment, and an aspirating pathway in fluid communication with the barrier structure in a manner effective to allow liquid on the lower surface to be aspiratingly withdrawn from the lower surface of the barrier plate.

In another aspect, the present invention provides an apparatus for processing a microelectronic workpiece that includes a processing chamber in which the workpiece is positioned during a treatment, a barrier structure including a lower surface having an outer periphery, a feature positioned in the apparatus in a manner effective to help attract or help contain a liquid on the lower surface of the barrier structure, and an aspirating pathway having a fluid inlet proximal to the feature in a manner effective to allow the contained or attracted liquid to be withdrawn from the lower surface of the barrier plate. The lower surface overlies and at least partially covers the workpiece during the treatment.

In another aspect, the present invention provides a method of treating a microelectronic workpiece that includes the steps of positioning the workpiece in a processing chamber of an apparatus, causing a barrier structure to overly the workpiece, subjecting the covered workpiece to a treatment that comprises introducing a liquid into the process chamber, and aspiratingly or wickingly removing a portion of the liquid that collects on the lower surface of the barrier structure. The barrier structure includes a lower surface that overlies at least a portion of the workpiece during the treatment In another aspect, the present invention provides a barrier structure that includes an annular shaped body having a lower surface that is nonperpendicular to an axis of the body, and an aspirating and/or wicking pathway in fluid communication with the lower surface that allows liquid on the lower surface to be withdrawn.

In another aspect, the present invention provides an apparatus for processing a microelectronic workpiece that includes a processing chamber in which the workpiece is positioned during a treatment, at least one nozzle through which a spray of at least one treatment material is introduced into the processing chamber, and a venturi-shaped pathway through which at least one gas is introduced into the process chamber.

In another aspect, the present invention provides a method of treating a microelectronic workpiece that includes positioning the workpiece in a processing chamber of an apparatus, causing a barrier structure to overly the workpiece, spraying a treatment material onto the workpiece, causing a venturi shaped pathway to be fluidly coupled to the through aperture, and during at least a portion of the spraying step, causing at least one gas to flow through the venturi-shaped pathway in a manner effective to help contain the mist in the process chamber. The barrier structure includes an open, through aperture overlying a central portion of the workpiece. The spraying generates a mist.

In another aspect, the present invention provides a method of treating a microelectronic workpiece that includes the steps of spraying at least one liquid onto the workpiece while said workpiece is positioned in a chamber having an aperture that is open during the spraying, providing a venturi-shaped pathway that is fluidly coupled to the open aperture, and using a gas flow accelerated through the venturi-shaped pathway to help contain the sprayed liquid in the chamber.

In another aspect, the present invention provides a method of treating a microelectronic workpiece that includes the steps of spraying at least one liquid onto the workpiece while said workpiece is positioned in a chamber having an aperture that is open during the spraying, providing a venturi-shaped pathway that is fluidly coupled to the open aperture, and using a gas flow accelerated through the venturi-shaped pathway to help contain the sprayed liquid in the chamber.

In another aspect, the present invention provides an apparatus for processing a microelectronic workpiece that includes a processing chamber in which the workpiece is positioned during a treatment, said workpiece having a radius and a spraying mechanism that includes at least a first array of nozzle openings through which a gas is dispensed and at least a second array of nozzle openings through which a liquid is dispensed. The first array of nozzle openings are positioned relative to said second array of nozzle openings in a manner effective to cause dispensed gas and liquid to atomizingly collide in an open space external to the first and second arrays of nozzle openings to provide a spray that contacts the workpiece. At least one of the first and second arrays of nozzle openings has a nozzle footprint that extends past the center of the workpiece in a manner effective to provide the spray with an on-workpiece footprint that spans a radius of the workpiece generally from the workpiece center at least partially to the outer periphery of the workpiece. The on-workpiece footprint of the spray having a span that is less than the span of the nozzle footprint of said at least one of the first and second arrays of nozzle openings.

In another aspect, the present invention provides a method of treating a microelectronic workpiece that includes the steps of causing a gas stream to be dispensed from a first array of nozzle openings and causing a liquid stream to be dispensed from a second array of nozzle openings, causing the gas and liquid streams to atomizingly collide under conditions effective to generate a spray that contacts the workpiece. The workpiece has a center and a radius. The on-workpiece footprint of the spray generally corresponds to the radius of the workpiece. At least one of the first and second arrays of nozzle openings has a dispensing footprint that is larger than the on-workpiece footprint of the spray. The dispensing footprint extends past the center of the workpiece.

In another aspect, the present invention provides an apparatus for processing a microelectronic workpiece that includes a relatively low thermal mass spraying mechanism that dispenses a spray onto the workpiece and a relatively high thermal mass barrier plate overlying the workpiece. The barrier plate includes at least one aperture through which the spray is dispensed toward the workpiece.

In another aspect, the present invention provides a method of treating a microelectronic workpiece that includes the step of using such an apparatus to dispense a material onto the workpiece.

In another aspect, the present invention provides an apparatus for processing a microelectronic workpiece that includes a spraying mechanism having at least one array of nozzle openings through which a fluid material is dispensed toward the workpiece, a barrier plate that has at least one aperture through which the fluid material is dispensed toward the workpiece, and a resilient element interposed between the spraying mechanism and the barrier plate in a manner effective to help accommodate a difference in the rates of thermal expansion between the spraying mechanism and the barrier plate. The spraying mechanism has a first rate of thermal expansion and the barrier plate has a second rate of thermal expansion different from the first rate of thermal expansion.

In another aspect, the present invention provides a method of treating a microelectronic workpiece that includes the step of using such an apparatus to dispense a material onto the workpiece.

In another aspect, the present invention provides an apparatus for processing a microelectronic workpiece that includes a processing chamber, a barrier structure, a spraying mechanism through which a liquid is dispensed, a feature to help attract or contain the liquid, an aspirating or wicking pathway, and a venturi-shaped pathway. The workpiece is positioned in the processing chamber during a treatment. The barrier structure includes a lower surface that overlies and at least partially covers the workpiece during the treatment. The barrier structure has a first aperture overlying a central portion of the workpiece. The first aperture is open and through. The spraying mechanism includes at least a first array of nozzle openings through which a gas is dispensed and at least a second array of nozzle openings through which a liquid is dispensed. The first array of nozzle openings are positioned relative to the second array of nozzle openings in a manner effective to cause dispensed gas and liquid to atomizingly collide in an open space external to the first and second arrays of nozzle openings to provide a spray that contacts the workpiece. At least one of the first and second arrays of nozzle openings has a nozzle footprint that extends past the center of the workpiece in a manner effective to provide the spray with an on-workpiece footprint that spans generally from the workpiece center at least partially to the outer periphery of the workpiece. The on-workpiece footprint of the spray has a span that is less than the span of the nozzle footprint of the at least one of the first and second arrays of nozzle openings. The feature is positioned in the apparatus in a manner effective to help attract or help contain the liquid that is present on the lower surface of the barrier structure. The aspirating or wicking pathway is in fluid communication with the barrier structure in a manner effective to allow the liquid that is present on the lower surface to be withdrawn from the lower surface of the barrier structure. At least one gas is introduced into the processing chamber through the venturi-shaped pathway. The venturi-shaped pathway is fluidly coupled to the first aperture of the barrier structure.

DETAILED DESCRIPTION OF PRESENTLY PREFERRED EMBODIMENTS

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. While the present invention will be described in the specific context of fluid based microelectronic substrate cleaning systems, the principles of the invention are applicable to other microelectronic processing systems as well.

FIGS. 1 through 37 show an illustrative tool 10 that incorporates principles of the present invention. For purposes of illustration, tool 10 is of the type in which a single workpiece 18 is housed in the tool 10 at any one time and subjected to one or more treatments in which liquid(s), gas(es), and/or other processing media are caused to contact the workpiece 18. In the microelectronics industry, for instance, tool 10 may be referred to as a single wafer processing tool. Workpiece 18 is typically a semiconductor wafer or other microelectronic substrate.

Figure 1:
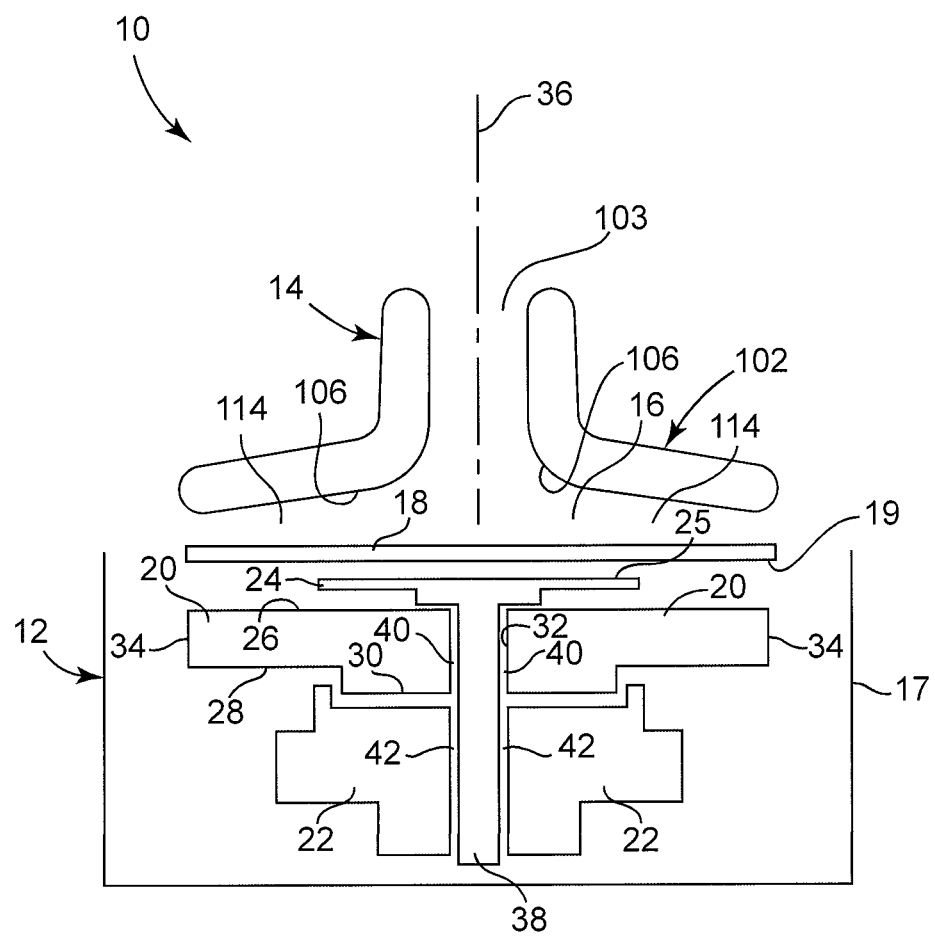
FIG. 1 schematically shows an apparatus incorporating principles of the present invention.
Figure 2:
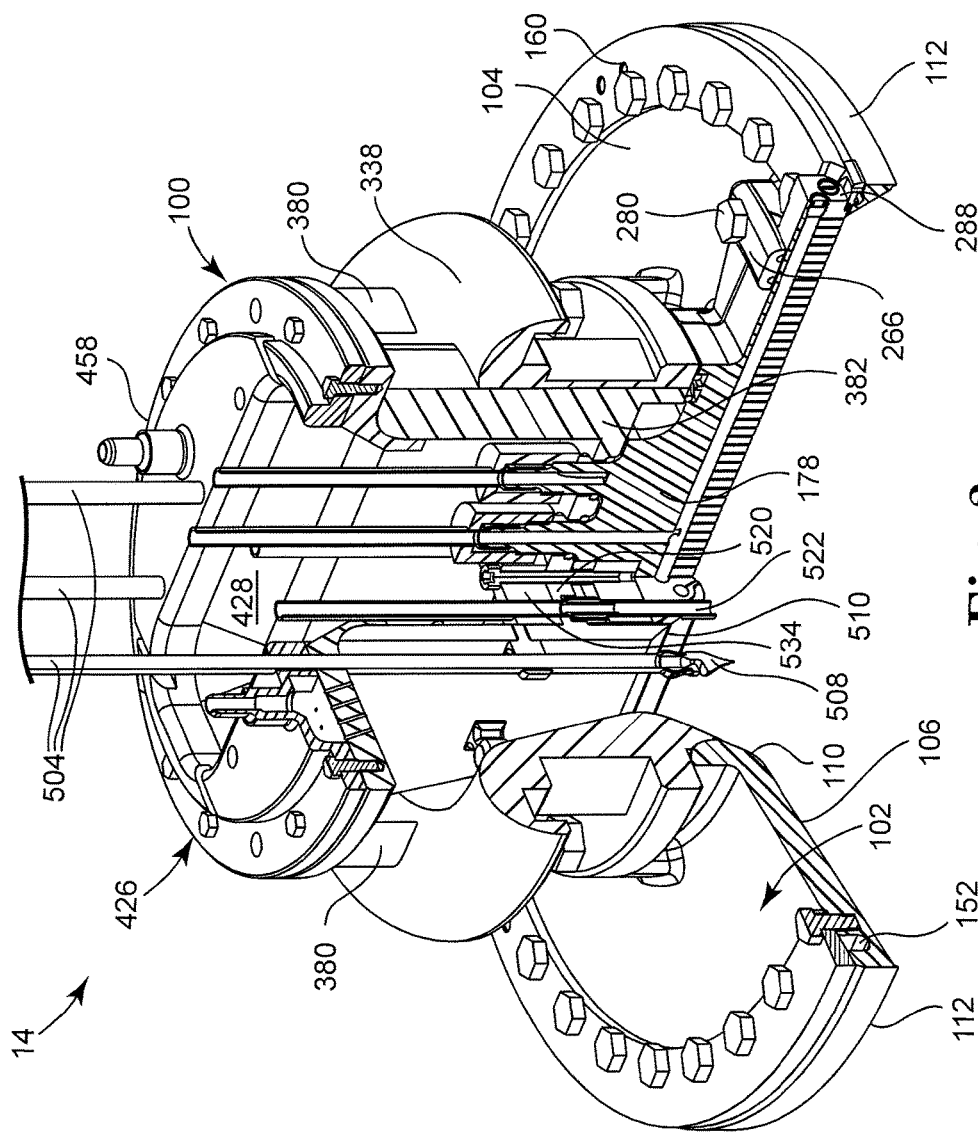
FIG. 2 is a perspective view, with some features shown in cross-section, of the barrier/dispense section shown schematically in FIG. 1.

Tool 10 generally includes as main assemblies a base section 12 and a barrier/dispense section 14. In FIG. 1, the base section 12 and the barrier/dispense section 14 are shown schematically. In FIGS. 2 though 37, details of the barrier/dispense section 14 and components thereof are shown in more detail. In actual use, the base section 12 and the barrier/dispense section 14 would be mounted to a framework (not shown) and enclosed within a housing (not shown) of tool 10. This mounting can occur in any manner such as via screws, bolts, rivets, adhesives, welds, clamps, brackets, combinations of these, or the like. Desirably, though, the sections 12 and 14 and/or components thereof are independently and removably mounted to facilitate service, maintenance, upgrade, and/or replacement.

Base section 12 and barrier/dispense section 14 help define processing chamber 16 in which workpiece 18 is positioned during processing. Base section 12 and/or barrier/dispense section 14 include one or more features or capabilities to allow workpiece 18 to be loaded into and taken from processing chamber 16. Such features and capabilities may include, for instance, a door that may be opened or closed to provide the desired egress. Alternatively, and as contemplated in preferred modes of practice, base section 12 and barrier/dispense section 14 are moveable relative to each other to provide this egress. Conveniently, this relative movement occurs by raising and lowering barrier dispense section 14 while keeping base section 12 fixed to the surrounding framework (not shown).

As seen schematically in FIG. 1, base section 12 generally includes a housing 17, chuck 20, motor 22, and backside dispense head 24. Inside processing chamber 16, workpiece 18 is supported and held by chuck 20. Chuck 20 is desirably cylindrical in shape and includes an upper face 26, lower face 28, annular base 30, central through bore 32, and sidewall 34 at the outer periphery. Chuck 20 may be stationary or it may be rotatable about a central axis 36. For purposes of illustration, the figures illustrate an embodiment of tool 10 in which chuck 20 is rotatably driven by motor 22 so that workpiece 18 may be spun about axis 36 during processing. In those embodiments in which workpiece 18 is spun by a rotating chuck 20, the spinning helps to spread dispensed treatment materials uniformly over the workpiece 18. Motor 22 may be of the hollow shaft type and may be mounted to tool 10 by any convenient approach.

Chuck 20 may secure workpiece 18 in any of a variety of different ways in accordance with conventional practices now or hereafter developed. Preferably, chuck 20 includes edge gripping structures (not shown) that securely hold workpiece 18 above upper face 25 of optional dispense head 24 (discussed below) such that there is a gap between workpiece 18 and the upper face 25. This kind of positioning allows treatment chemicals, including rinse water, to be dispensed onto either the upper face or lower face of workpiece 18.

Optionally, tool 10 may include dispense structure(s) for treating the lower face 19 of workpiece 18. An illustrative backside dispense mechanism is shown as a generally circular dispense head 24 in which one or more treatment chemicals may be dispensed toward lower face of workpiece 18. Treatment chemicals are supplied to backside dispense head 24 via shaft 38 that passes through central bore 40 of chuck 20 and central bore 42 of motor 22. In embodiments in which chuck 20 rotates, there are gaps between shaft 38, and central bores 40 and 42 so that the parts do not contact as the chuck 20 rotates. The backside dispense head 24 may be coupled to one or more supplies (not shown) of treatment materials to be dispensed as supplied or blended on demand.

In particularly preferred embodiments, the base section 12 is in the form of the "processing section 11" described and illustrated in assignee's Co-Pending Applications Nos. 1 and 2. In other words, the barrier dispense section 14 of the present specification advantageously may be coupled to the "moveable member 526" and thereby substituted for the "dispense assembly 554" of Assignee's Co-Pending Applications Nos. 1 and 2.

FIGS. 2 through 37 show more details of an illustrative embodiment of one kind of preferred barrier/dispense section 14 useful in dispensing one or more processing materials in the course of processing one or more microelectronic workpieces 18. The dispensing components of barrier/dispense structure 14 may be coupled to one or more supplies (not shown) of treatment materials provided via supply lines (not shown). These materials can be dispensed as supplied or blended on demand. A wide variety of treatment materials may be used, as tool 10 is quite flexible in the types of treatments that may be carried out. Just a small sampling of representative treatment materials include gases and liquids such as nitrogen, carbon dioxide, clean dry air, argon, HF gas, aqueous HF, aqueous isopropyl alcohol or other alcohols and/or tensioactive material(s), deionized water, aqueous or other solutions of ammonium hydroxide, aqueous or other solutions of sulfuric acid, aqueous or other solutions of nitric acid, aqueous or other solutions of phosphoric acid, aqueous or other solutions of hydrogen chloride, hydrogen peroxide, ozone gas, aqueous ozone, organic acids and solvents, combinations of these and the like.

Representative examples of processes and chemistries suitably practiced in tool 10 include those described in Publication No. 2006-0219258-A1, the disclosure of which is fully incorporated herein by reference. Other representative examples of processes and chemistries suitably practiced in tool 10 include those described in Assignee's co-pending application Ser. No. 60/819,179, filed, Jul. 7, 2006, naming Jeffrey Butterbaugh as one of the inventors, and entitled LIQUID AEROSOL PARTICLE REMOVAL METHOD, the disclosure of which is fully incorporated herein by reference in its entirety for all purposes.

The preferred barrier/dispense section 14 comprises dispense assembly 100 which desirably would be mounted to the lower end of "moveable support member 526" of Assignee's Co-Pending Applications Nos. 1 and 2. Dispense assembly 100 generally includes one or more independent mechanisms for dispensing treatment materials into the processing chamber 16. For instance, the illustrative embodiment of dispense assembly 100 includes at least one, preferably at least two, and more preferably at least three different kinds of dispensing capabilities. As one capability, these mechanisms include one or more dispensing structures that allow assembly 100 to spray one or more treatment fluids downward toward workpiece 18, generally across a radius of workpiece 18 so that full surface coverage is obtained via rotation of the workpiece 18 below the spray. In preferred embodiments, this capability is provided by a dispensing structure such as spray bar 178. Center dispense nozzle assembly 518 allows treatment materials to be dispensed downward generally toward the center of workpiece 18. As workpiece 18 spins, the centrally dispensed materials are distributed over the workpiece surface. Additionally, showerhead dispense member 426 provides still yet another way to introduce processing materials, typically gases, vapors, and/or entrained materials into the processing chamber 16.

In more detail, and as seen best in FIGS. 1 through 9 and 14, barrier plate 102 includes an annular body 104 having a lower surface 106, and upper surface 108, and inner periphery 110, and an outer periphery 112 Inner periphery 110 is generally rounded to help promote smooth gas flow through the central apertures 120 and 122. Advantageously, lower surface 106 of barrier plate 102 includes one or more features that help to collect and remove liquid that may be present. These features may include depressions (e.g., troughs, grooves, etc.) and/or protuberances (e.g., buttons, rims, posts, etc.), combinations of these, or the like that help to attract, contain, and/or withdraw the liquid. These features may be present on the barrier plate 102 itself or may be proximal to the barrier plate 102 in an operative manner.

The present invention contemplates that one or more strategies may be used singly or in combination for removing the liquid from the lower surface 106 of the barrier plate 102. In some embodiments, sources of one or more drying gases may be directed onto the lower surface 106 of the barrier plate 102 in order to blow the liquid away. In other embodiments, wicking features may be included on or proximal to the lower surface 106 of the barrier plate 102. For example, if the lower surface 106 of the barrier plate 102 is hydrophilic, hydrophilic feature(s) may be positioned, or moved to a position, to wick away liquid. Aspiration techniques may also be used, and this strategy is illustrated in the Figures.

Figure 6:
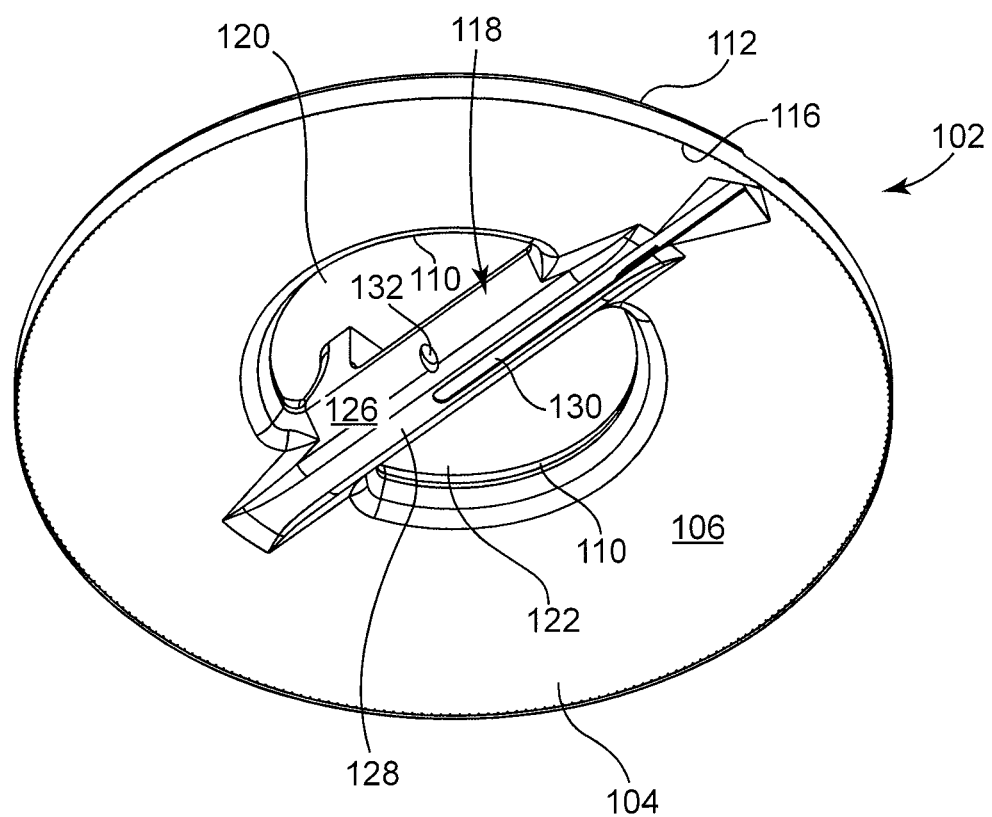
FIG. 6 is a perspective view of the barrier plate used in the barrier/dispense section of FIG. 2, looking toward the bottom of the barrier plate.
Figure 7:
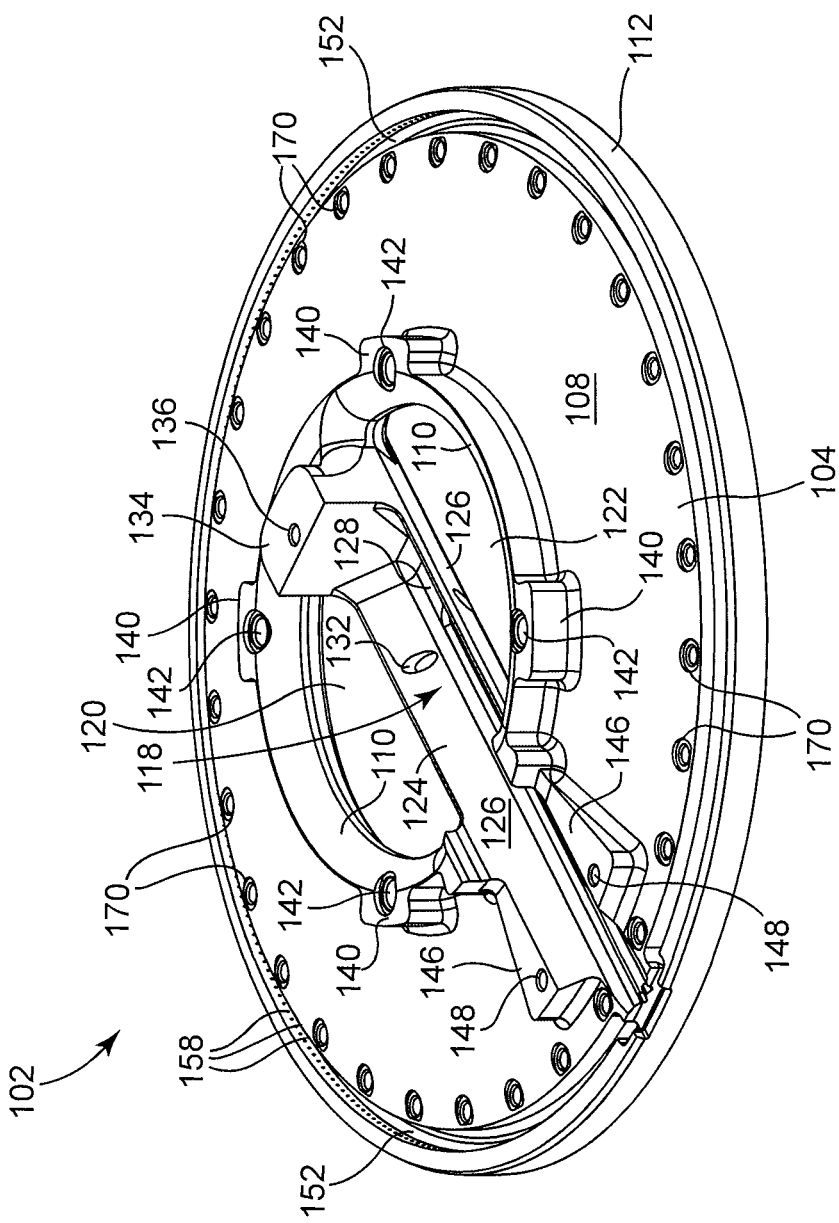
FIG. 7 is a perspective view of the barrier plate used in the barrier/dispense section of FIG. 2, looking toward the top of the barrier plate.
Figure 8:
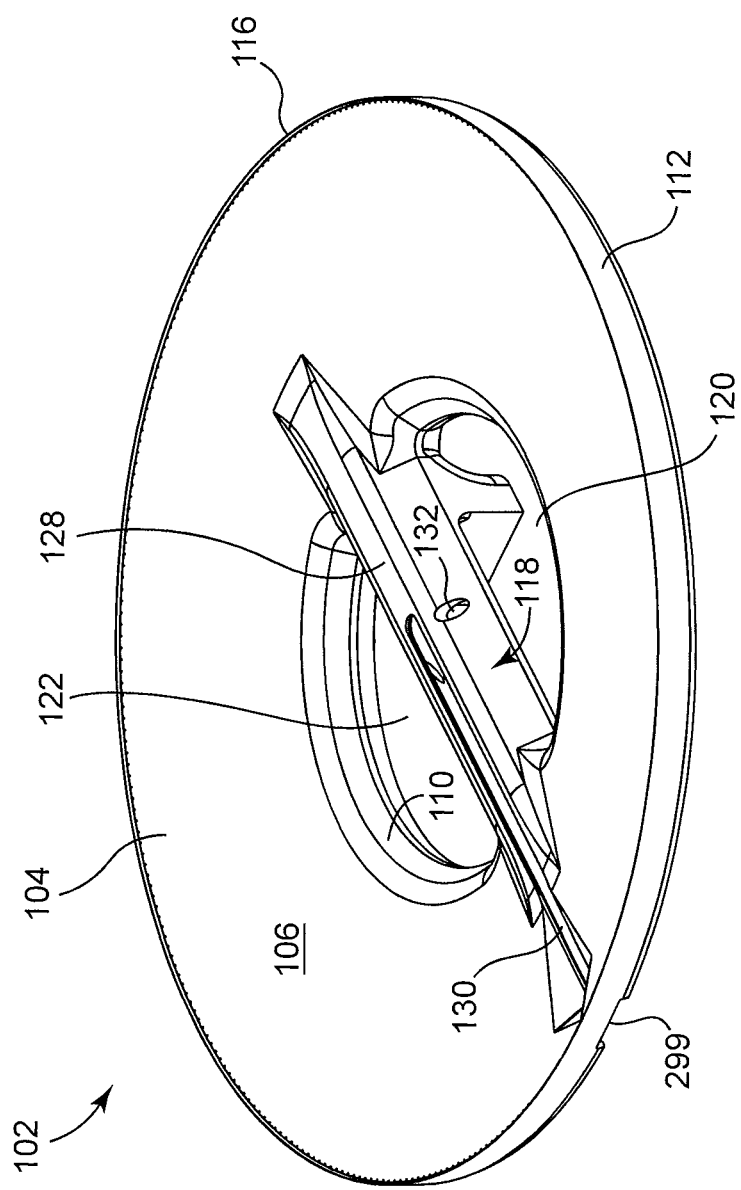
FIG. 8 is a perspective view of the barrier plate used in the barrier/dispense section of FIG. 2, looking generally toward the bottom of the barrier plate.
Figure 9:
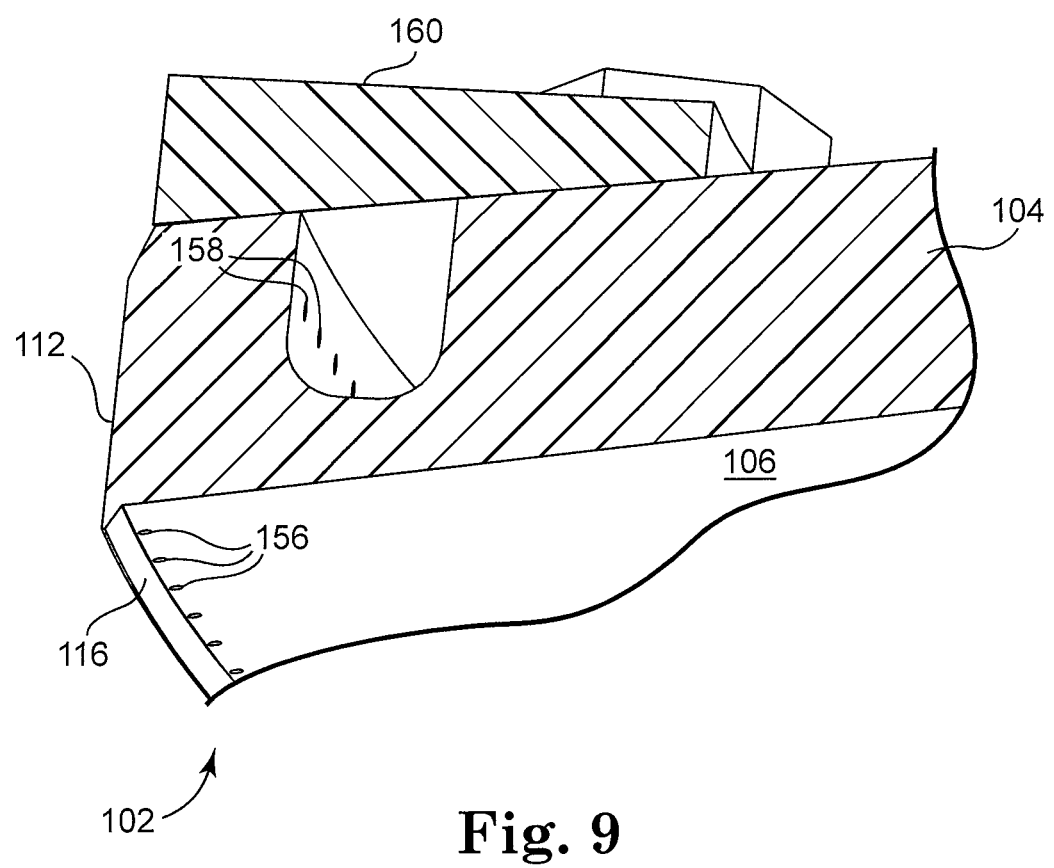
FIG. 9 shows a portion of the barrier plate of FIG. 5 in which the aspiration trough can be seen along with some associated features and components shown in cross-section.
Figure 10:
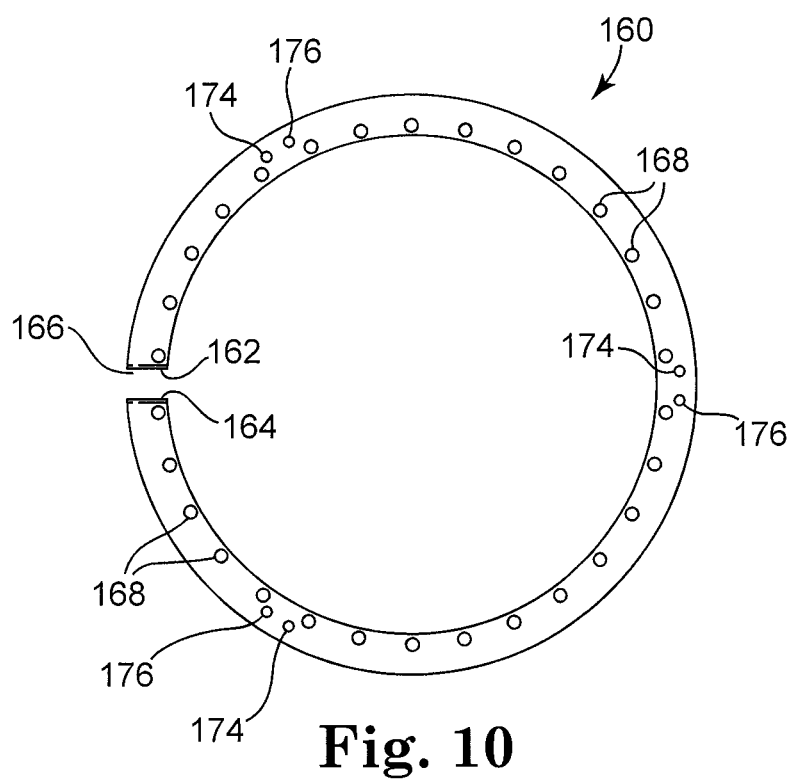
FIG. 10 is a top view of the seal ring used to cover the aspiration trough shown in FIG. 9.
Figure 11:
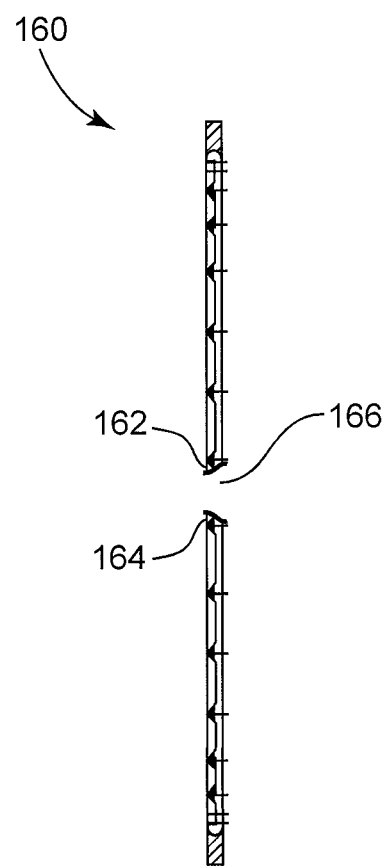
FIG. 11 is a side cross-section view of the seal ring shown in FIG. 10.

For purposes of illustrating one way to apply aspiration techniques to dry the barrier plate 102, FIGS. 6, 8, and 9 show annular rim 116 that projects downward from lower surface 106 proximal to the outer periphery 112. As will be described further below, annular rim 116 helps to collect liquids on the lower surface 106 so that these liquids can be aspirated away. Aspiration of the collected liquid helps to dry the lower surface 106 and to prevent unwanted dripping from lower surface onto the underlying workpiece 18. Via z-axis movement of "moveable support member 526" according to Assignee's Co-pending Applications Nos. 1 and 2, the position of barrier plate 102 relative to the underlying workpiece 18 can be controlled.

Preferably, at least lower surface 106 of barrier plate 102 is angled downward in a radially outward direction relative to the underlying radii of workpiece 18 to establish a tapering flow channel 114 between workpiece 18 and lower surface 106 of barrier plate 102. The tapering configuration of channel 114 helps to promote radial flow outward from the center of workpiece 18 while minimizing recirculation zones. The taper also helps to smoothly converge and increase the velocity of flowing fluids approaching the outer edge of workpiece 18. This helps to reduce liquid splash effects. The angle of lower surface 106 also helps liquid on lower surface 106 to drain toward annular rim 116, where the collected liquid can be aspirated away rather than drip downward onto workpiece 18 or the apparatus (not shown) used to deliver or remove workpiece 18 from the process chamber 16. The tapering configuration also helps to reduce recirculation of particles back onto workpiece 18. The configuration also helps facilitate chemical reclaim efficiency by better containment of fluids.

Additionally with respect to this particular embodiment, the generally annular barrier plate 102 of dispense assembly 100 functions in one respect as a lid over processing chamber 16 in order to help provide a protected environment for workpiece treatment and to help contain dispensed materials in the processing chamber 16. However, the generally annular body 104 preferably does not seal processing chamber 16, but rather comes into close proximity with other barriers helping to define processing chamber 16.

The angled lower surface 106 can have a variety of geometries. For instance, the geometry can be one or more of linear (conical), parabolic, polynomial, or the like. For purposes of illustration, the lower surface 106 generally linearly converges toward workpiece 18 in a radially outward direction.

Barrier plate 102 includes an arm 118 that subdivides the open central area into first and second intake apertures 120 and 122. During processing, fluid process media can be caused to flow into processing chamber 16 through these apertures. Viewable from top surface 108, arm 118 and an adjoining portion of annular body 104 are shaped to provide a pocket 124 for holding spray bar 178. Pocket includes side faces 126 and bottom 128. Bottom 128 includes a slot 130 through which spray bar 178 sprays material downward onto workpiece 18 during processing. Centrally located holes 132 are formed in side faces 126. Central dispense nozzle features (described further below) are fed through these holes 132 for dispensing treatment materials generally onto the center of the underlying workpiece 18.

Viewable from top surface 108, arm 118 further includes a raised boss 134 including threaded bore 136. Showerhead spacer 382 (discussed further below) is supported upon and secured to boss 134 using a fastener such as a threaded screw. Additional raised bosses 140 are distributed around inner periphery 110 of annular body 104. One or more of these raised bosses 140 may include one or more threaded bores 142. Air intake flange 338 (described further below) is supported upon and fastened to these bosses 140 such as by screws threadably engaging threaded bores 142. For purposes of illustration, four distinct raised bosses 140 are shown. In other embodiments, more or less of these bosses 140 may be used. In some embodiments, one or more of such bosses 140 may span longer portions of the inner periphery 110, although the use of discrete bosses 140 as shown helps with weight reduction.

Additional raised bosses 146 are also provided on upper surface 108 on each side of pocket 124 near outer periphery 112. Each of bosses 146 includes at least one threaded bore 148. A retainer plate 266 (described further below) is secured to these bosses 146 in order to help secure spray bar 178 in pocket 124. The retainer plate 266 is fastened to these bosses via screws that threadably engage the bores 148.

As part of the aspiration system incorporated into barrier plate 102, an annular trough 152 is formed in top surface 108 proximal to the outer periphery 112 of annular body 104. Aspirating channels (not shown) extend between ports 156 located on the lower surface 106 of annular body 104 to corresponding ports 158 opening into trough 152.

As seen best in FIGS. 2 through 4 and 9 through 11, seal ring 160 is fastened to annular body 104 over trough 152 to seal the top opening of trough 152. Seal ring 160 may be secured to annular body 104 in any convenient fashion. By way of example, seal ring 160 includes an array of apertures 168 that allow seal ring to be secured over trough 152 by fastening screws 172 through apertures 168 and into threaded bores 170 in the top surface 108 of annular body 104. The seal ring 160 is annularly shaped with a notch 166 through the ring defining ends 162 and 164. The end 202 of spray bar 178 fits into this notch 166 when the spray bar 178 is fit into pocket 124 and secured in place. Additionally, seal ring 160 is provided with egress holes 174 and 176 that provide egress for plumbing components to access trough 152. For purposes of illustration three pairs of holes 174 and 176 are provided in seal ring 160. In representative embodiments, one hole 174 of each such pair is coupled to plumbing (not shown) that allows a vacuum to be pulled on trough 152. The vacuum helps to pull liquid material from the lower surface 106 into trough 152 via aspiration channels (not shown). The other hole 176 of each pair may be used to lead sump tubing deeper into trough 152 to suck out liquid that is collected there. Advantageously, perimeter aspiration helps to keep the bottom of barrier plate 102 clean and dry and also helps to prevent defects on workpiece 18 arising from drips or particles.

At least the lower surface 106 of annular body 104 may be hydrophilic or hydrophobic, as desired, depending upon the nature of the treatment(s) that might be carried out using tool 10. In preferred embodiments, it is preferred that the lower surface 106 be made from a hydrophilic material such as quartz, because this 1) facilitates drainage of liquids on the barrier plate towards the aspirator on the edge, 2) causes liquids to spread out on the surface, leaving a thinner film and thus speeding drying, and/or 3) maintains desirable hydrophilic properties when exposed to many different chemicals.

Spray bar 178 is shown best in FIGS. 2 through 4 and 12 through 15. Spray bar 178 has top 188, bottom 180, first end 200 generally overlying the center area of the underlying workpiece 18, and second end 202 generally overlying the outer periphery of the underlying workpiece 18. Spray bar 178 includes features facilitating assembly with other components of dispense assembly 100. Additionally, pockets 208 and 212 each include respective tabs 210 and 214. Respective o-rings (not shown) fit into these pockets and are sized so as to project above the surface of top 188. The o-rings provide a resilient bearing surface when securing the showerhead spacer 382 to the spray bar 178. The o-rings further help to provide thermal isolation between the relatively low thermal mass spraybar 178 and the relatively greater thermal mass barrier plate 102. This improves the temperature uniformity of fluids dispensed through the spraybar which results in better process uniformity on the workpiece. Dispensing hot fluids through the spraybar can result in significant temperature differentials between the spraybar and the barrier plate. The o-rings further help to provide a compliant mounting system that allows for differential thermal expansion between the spraybar and barrier plate while minimizing stresses in components at higher dispense pressures.

Additionally, pocket 204 holds center dispense nozzle retainer 520 and includes holes 206 allowing the center dispense tubes 522 to pass through to a position at which the tubes 522 can deliver treatment media to the process chamber 16.

Spray bar 178 further includes features that allow one or more processing materials to be sprayed downward generally across a radius of the workpiece 18. A generally triangular groove 182 is formed on the bottom 180. Groove 182 includes an apex region 184 and adjoining faces 186. Apex region 184 and faces 186 include nozzle features that allow material(s) to be dispensed from spray bar 178 and sprayed onto the workpiece 18. This groove 182 generally spans slightly more than the full radius of the underlying workpiece 18 to help ensure that spray dispensed from the nozzle features has a spray footprint at the workpiece that spans at least the full radius of the workpiece. The footprint of the sprayed material upon the workpiece 18 will be discussed in more detail below in connection with FIGS. 20a through 20c.

In order to supply treatment materials to the nozzle features of spray bar 178, supply tubes 222 and 246 convey such materials to fluid inlet member 216 and fluid inlet member 240. Fluid inlet member 216 is part of a fluid pathway that conveys treatment materials to nozzle array 234 at the apex 184 of groove 182. Channel 262 is part of a fluid pathway between fluid inlet member 216 and nozzle array 234. Fluid inlet member 216 includes threaded base 218 (threads not shown) and flare coupling 220. Supply tube 222 is secured to flare coupling 220 by retaining nut 224. Fluid inlet member 240 is part of a fluid pathway that conveys treatment materials to the nozzle arrays 260 provided on faces 186 of groove 182. Channels 264 and 265 are part of a fluid pathway between fluid inlet member 240 and nozzle arrays 260. Plugs 238 and 236 are inserted on the ends of channels 262, 264, and 265.

Fluid inlet member 240 includes threaded base 242 (threads not shown) and flare coupling 244. Supply tube 246 is attached to flare coupling 244 and held in place by retaining nut 248. The fluid pathways between fluid inlet members 216 and 240 and their respective array(s) of nozzle openings may be provided as shown with respect to the spray bar arms shown in Assignee's Co-Pending Patent Applications.

Figure 12:
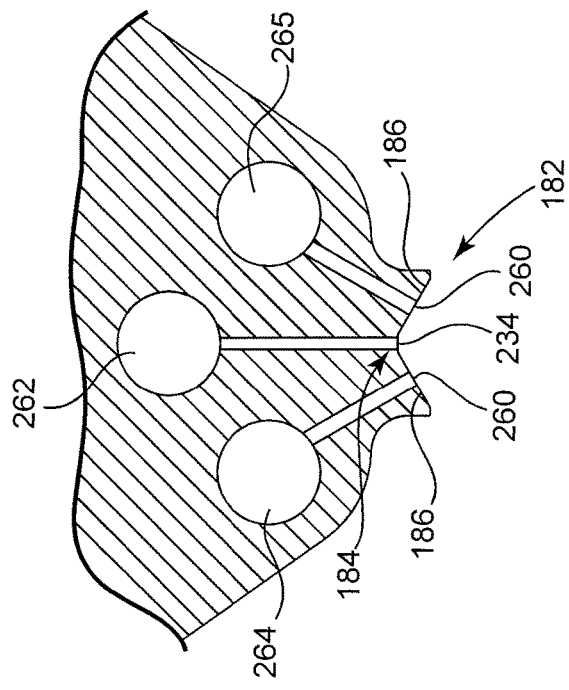
FIG. 12 is a schematic cross-section of the spray bar used in the barrier-dispense section of FIG. 2, showing fluid pathways through which materials may be dispensed through nozzle openings of the spray bar.
Figure 13:
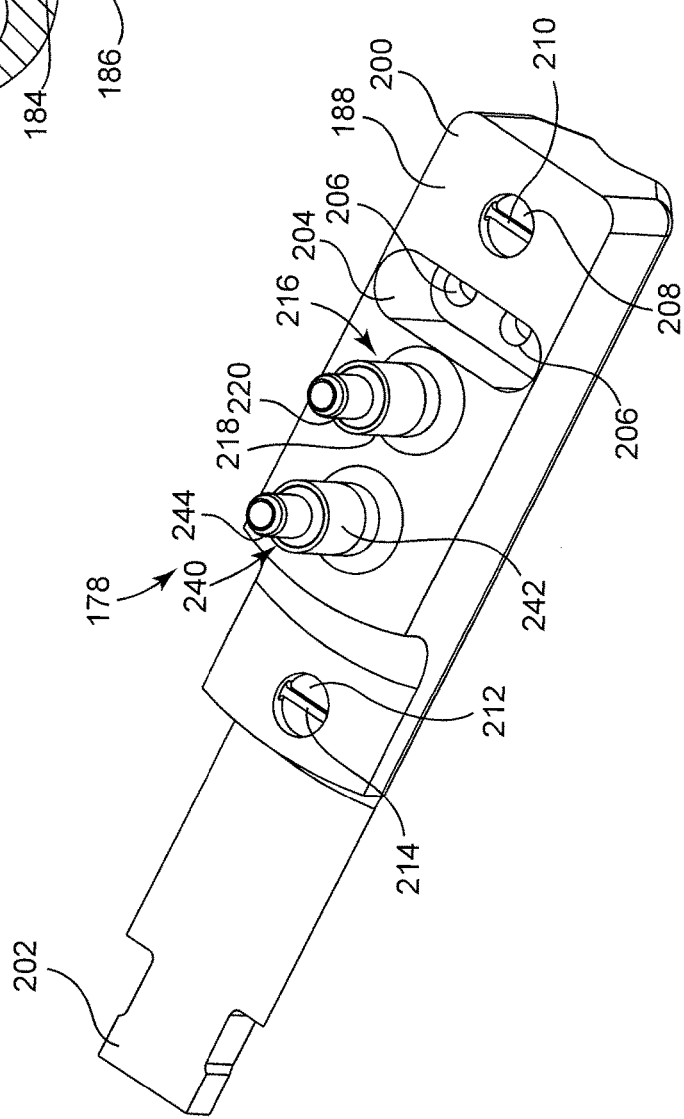
FIG. 13 is a perspective view of the spray bar used in the barrier-dispense section of FIG. 2, generally looking toward the top of the spray bar.
Figure 14:
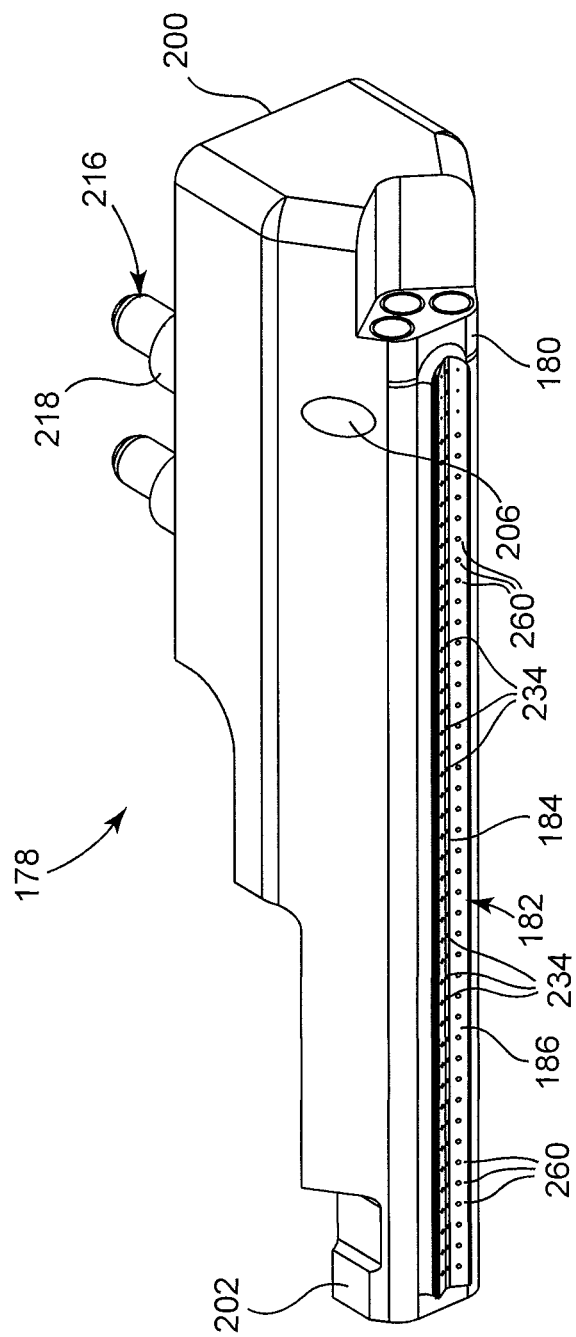
FIG. 14 is a perspective view of the spray bar used in the barrier-dispense section of FIG. 2, generally looking toward the bottom of the spray bar.
Figure 15:
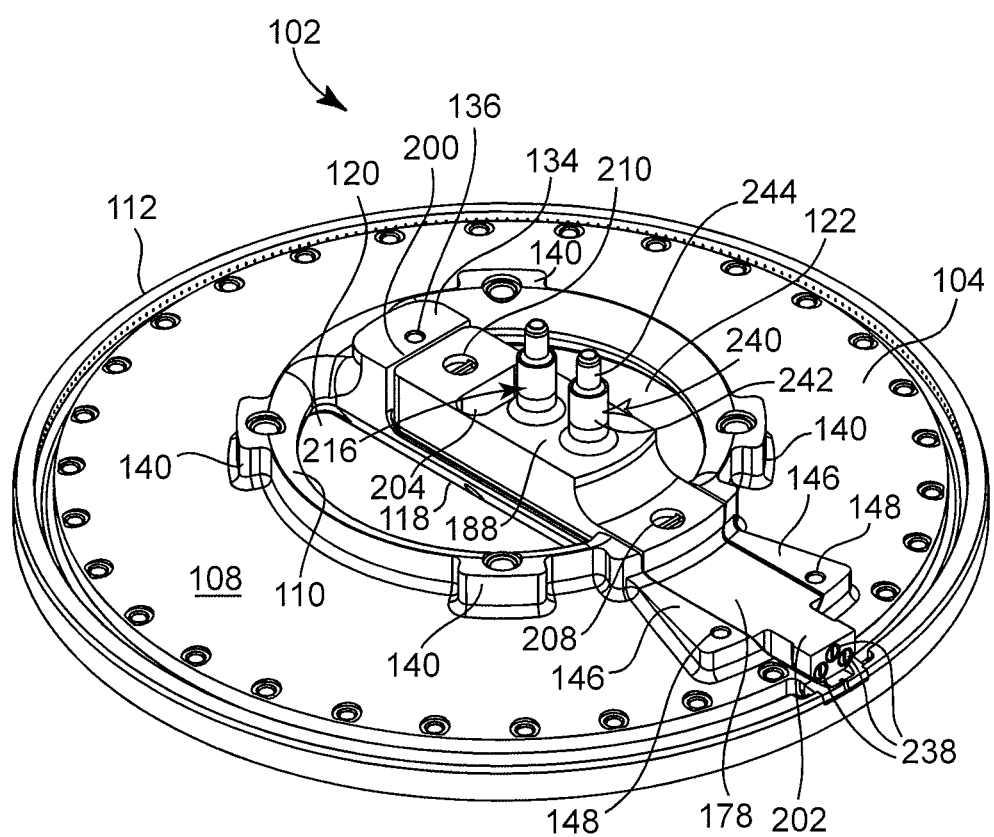
FIG. 15 is a perspective view showing an assembly including the spray bar of FIG. 14 placed into position in the pocket of the barrier plate of FIG. 5.

Liquids, gases, or combinations of these may be dispensed using spray bar 178. In typical embodiments, as shown in FIG. 12, liquid material (not shown) is conveyed through channels 264 and 265 and dispensed through nozzle arrays 260 on the faces 186 of the spray bar groove 182, while a pressurized gas (not shown) is conveyed through channel 262 and dispensed from the nozzle array 234 positioned along the apex 184 of the groove 182. The gas jet collides with the liquid streams, atomizing the liquid material into fine droplets (not shown). After the collision, the gas jet helps transport the atomized liquid to the workpiece 18. In other modes of practice, only liquid material is dispensed from the nozzle arrays on the adjacent faces. After colliding, the combined liquid stream contacts the workpiece 18. In other aspects of practice, only gas material(s) may be dispensed through nozzle array at the apex and/or the nozzle arrays at the adjacent faces.

The nozzle spacing, dispense trajectory with respect to the surface of workpiece 18, the orifice size of the nozzle openings, and the like may be varied to adjust the characteristics (e.g., spray characteristics) of the dispensed streams. For instance, the nozzle spacing and opening sizes may be uniform or varied.

Figure 20A:
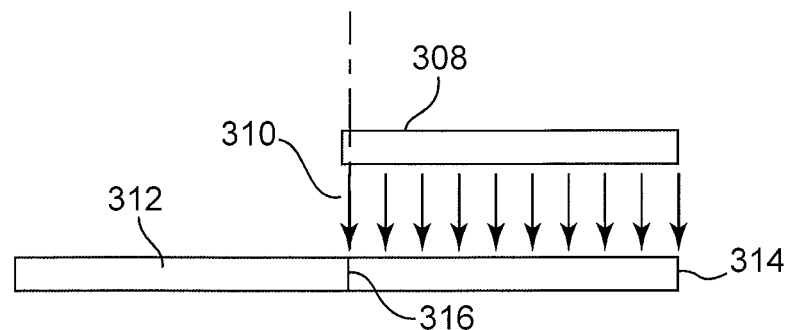
FIGS. 20a, 20b, and 20c schematically illustrate how a Bernoulli effect can impact the on-workpiece footprint of an atomized spray.
Figure 20B:
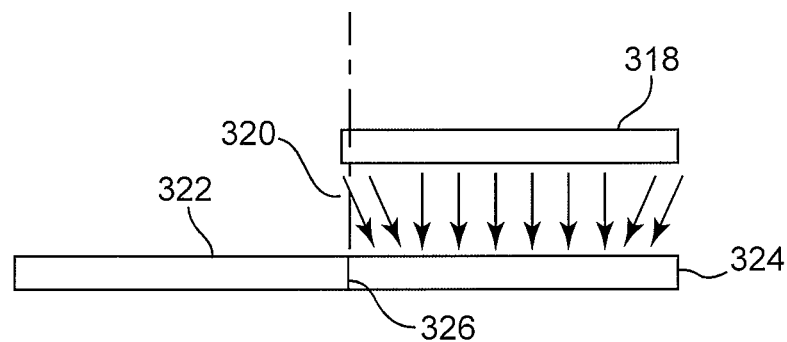
Figure 20C:
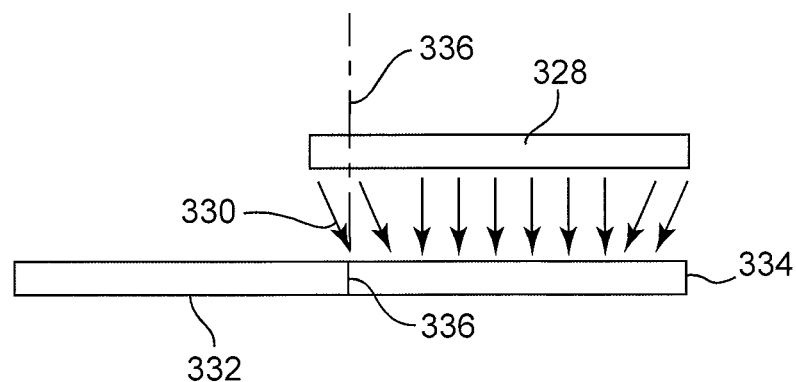
Figure 21:
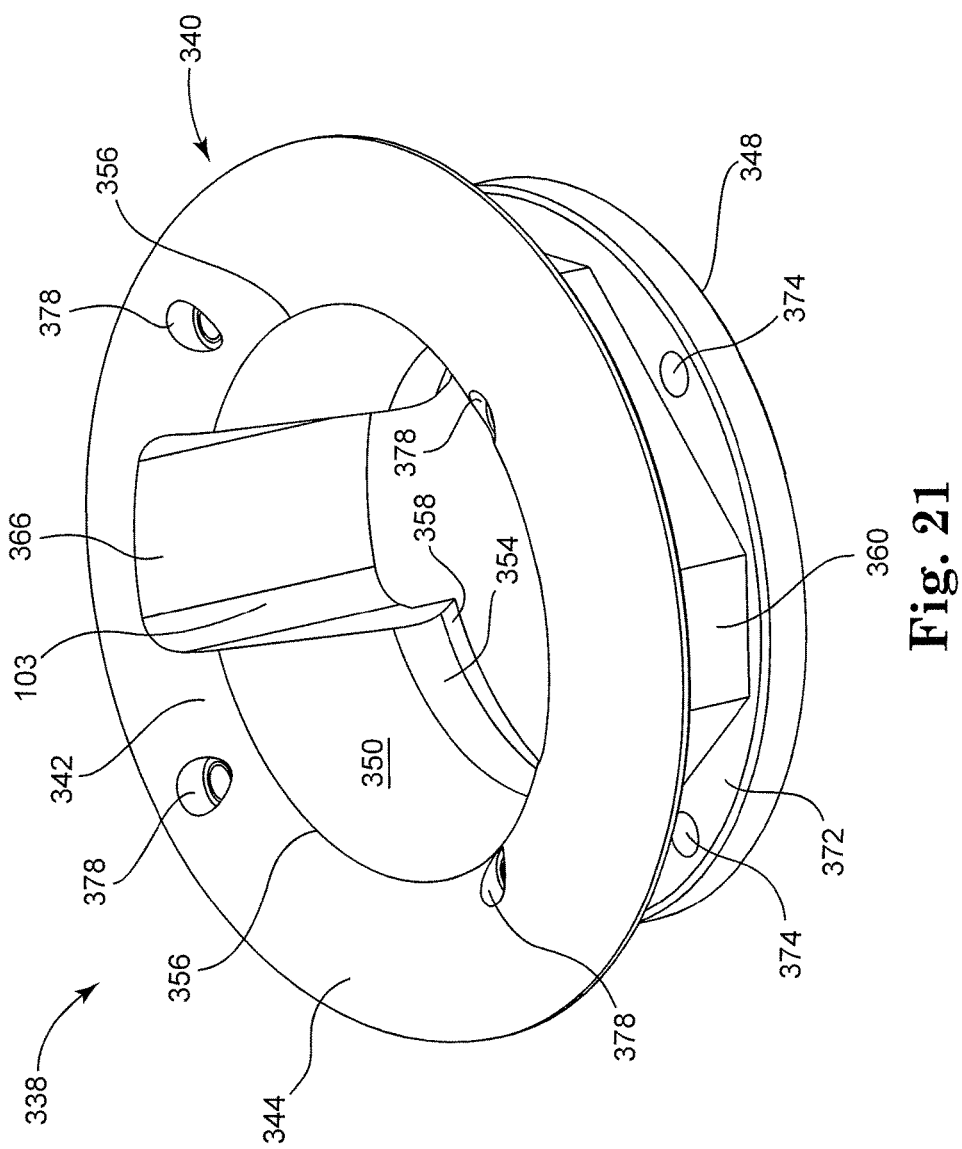
FIG. 21 is a perspective view of an air intake flange used in the barrier/dispense section of FIG. 2, generally looking at the top of the flange.
Figure 22:
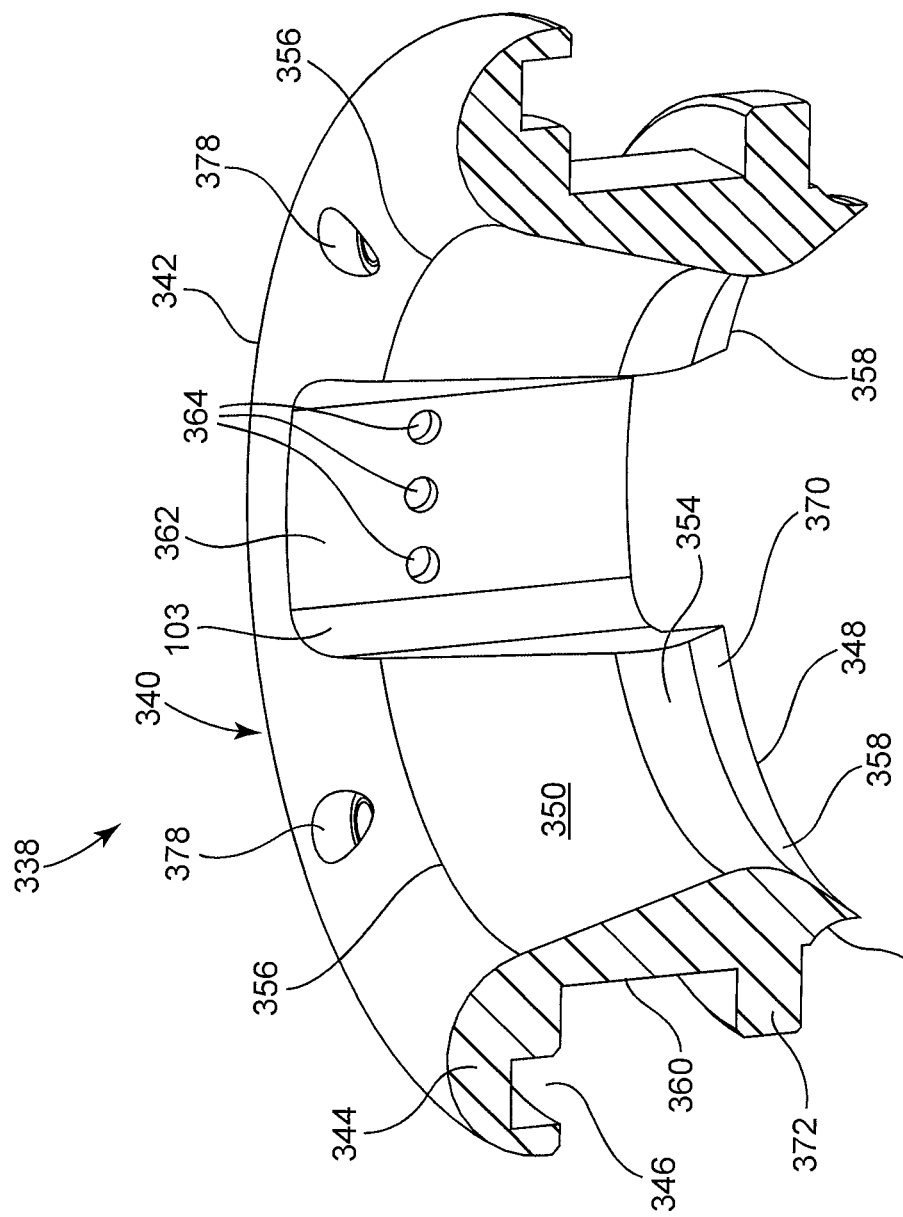
FIG. 22 is a perspective view of an air intake flange used in the barrier/dispense section of FIG. 2, generally looking at the top of the flange and shown in cross-section.
Figure 23:
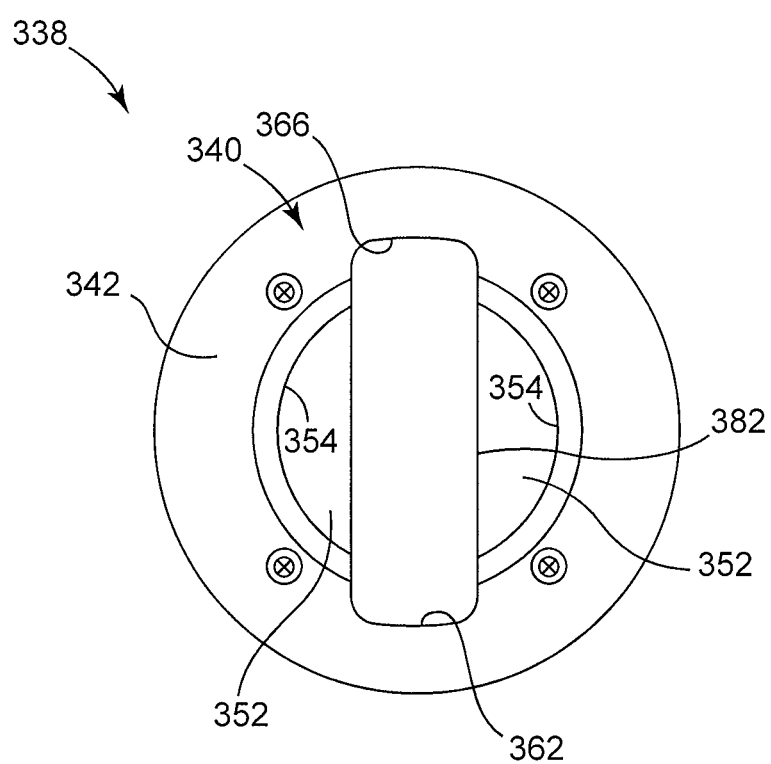
FIG. 23 is a top view of the air intake flange used in the barrier/dispense section of FIG. 2, generally looking at the top of the flange.
Figure 25:
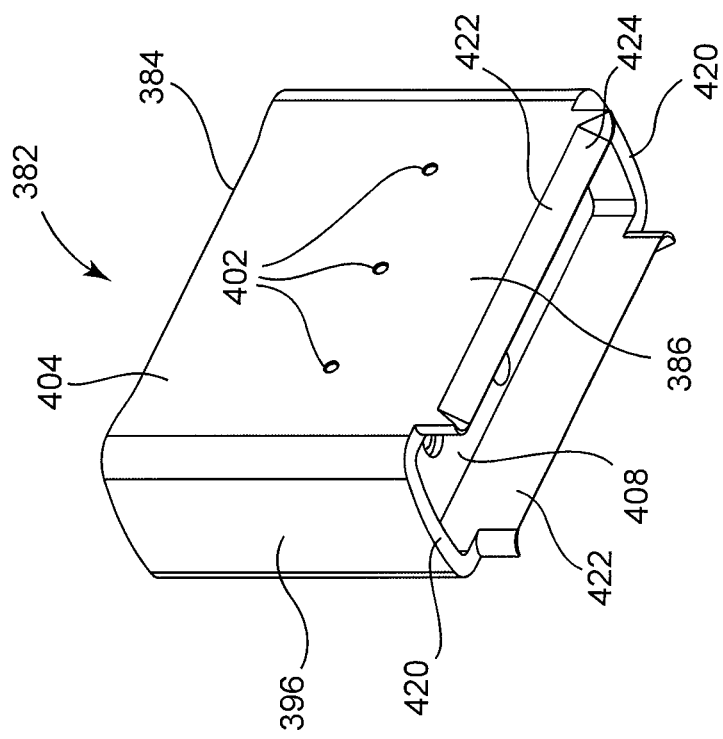
FIG. 25 is a perspective view of the showerhead spacer used in the barrier/dispense section of FIG. 2 generally looking toward the bottom.
Figure 24:
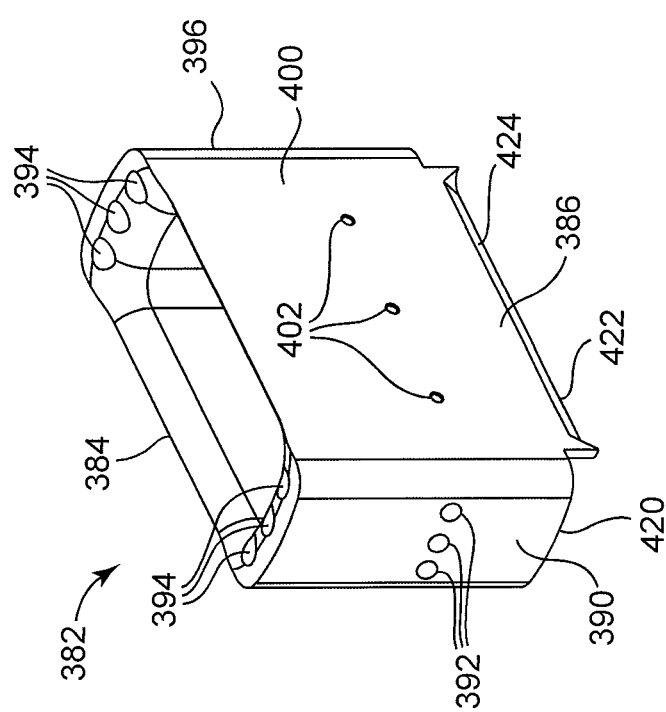
FIG. 24 is a perspective view of the showerhead spacer used in the barrier/dispense section of FIG. 2 generally looking toward the top.
Figure 26:
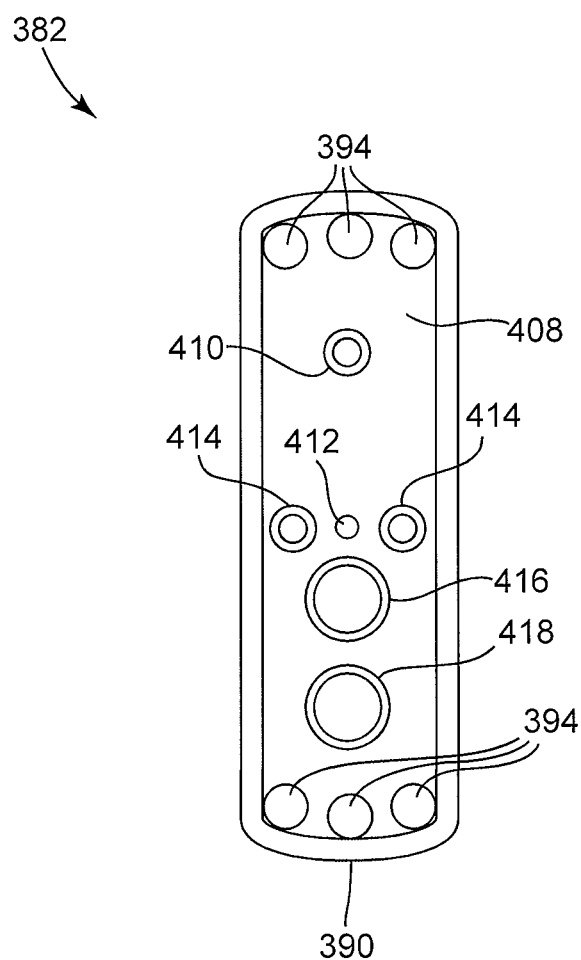
FIG. 26 is a top view of the showerhead spacer used in the barrier/dispense section of FIG. 2.
Figure 27:
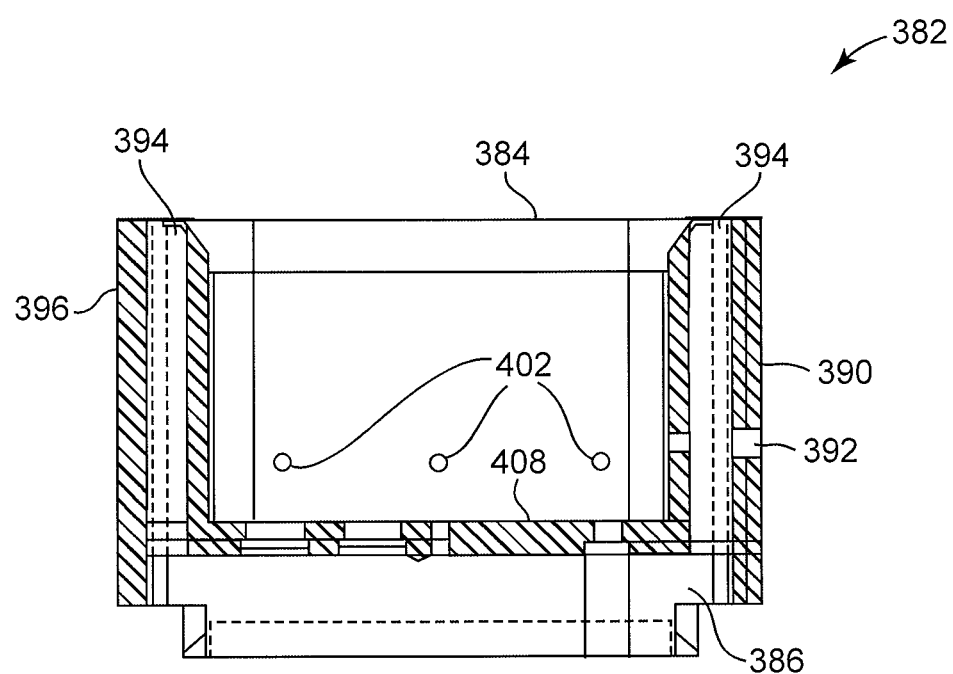
FIG. 27 a side cross-section view of the showerhead spacer used in the barrier/dispense section of FIG. 2.
Figure 28:
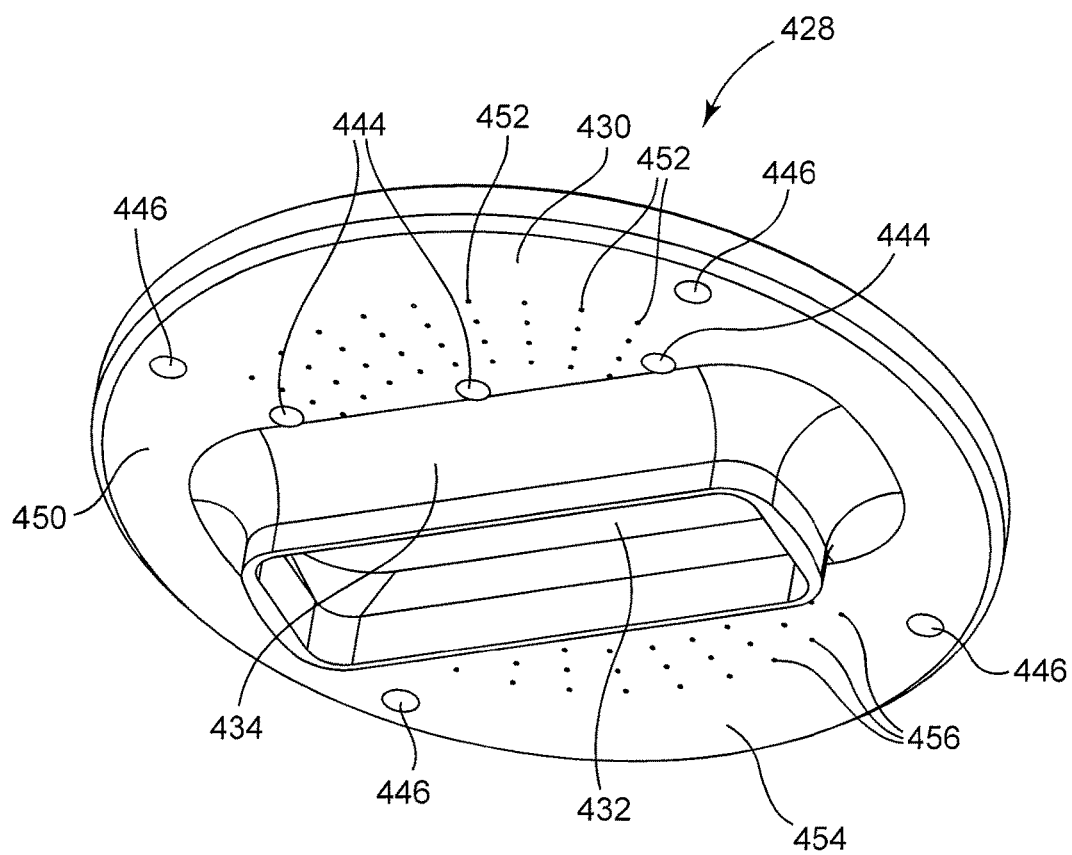
FIG. 28 is a perspective view of the base used in the showerhead assembly of the barrier/dispense section of FIG. 2.
Figure 29:
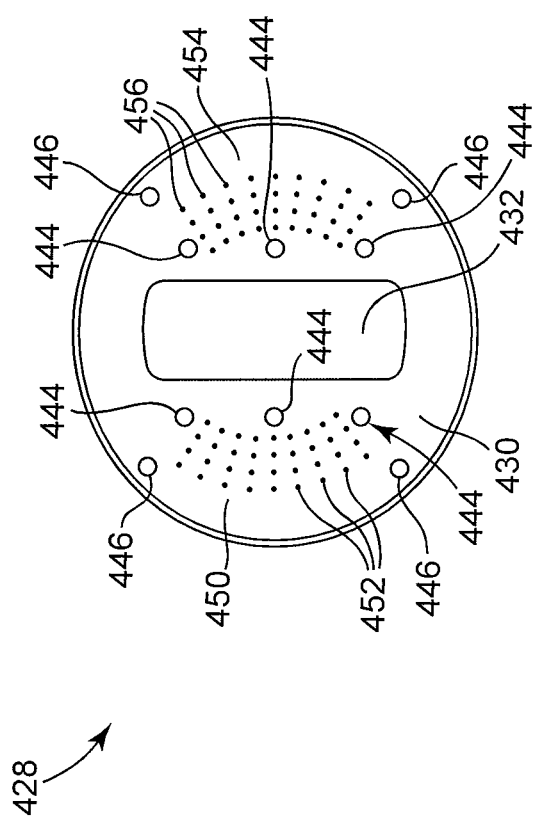
FIG. 29 is a top view of the base used in the showerhead assembly of the barrier/dispense section of FIG. 2.
Figure 30:
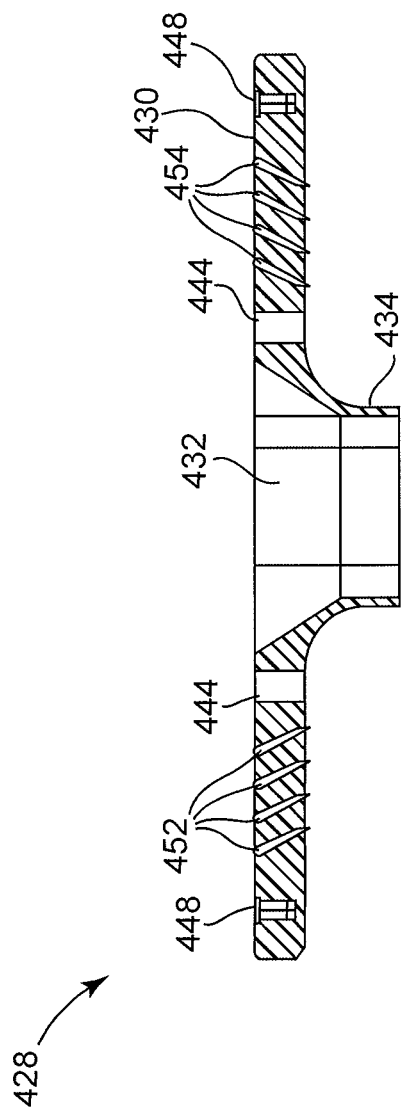
FIG. 30 is a side cross-section view of the base used in the showerhead assembly of the barrier/dispense section of FIG. 2.
Figure 31:
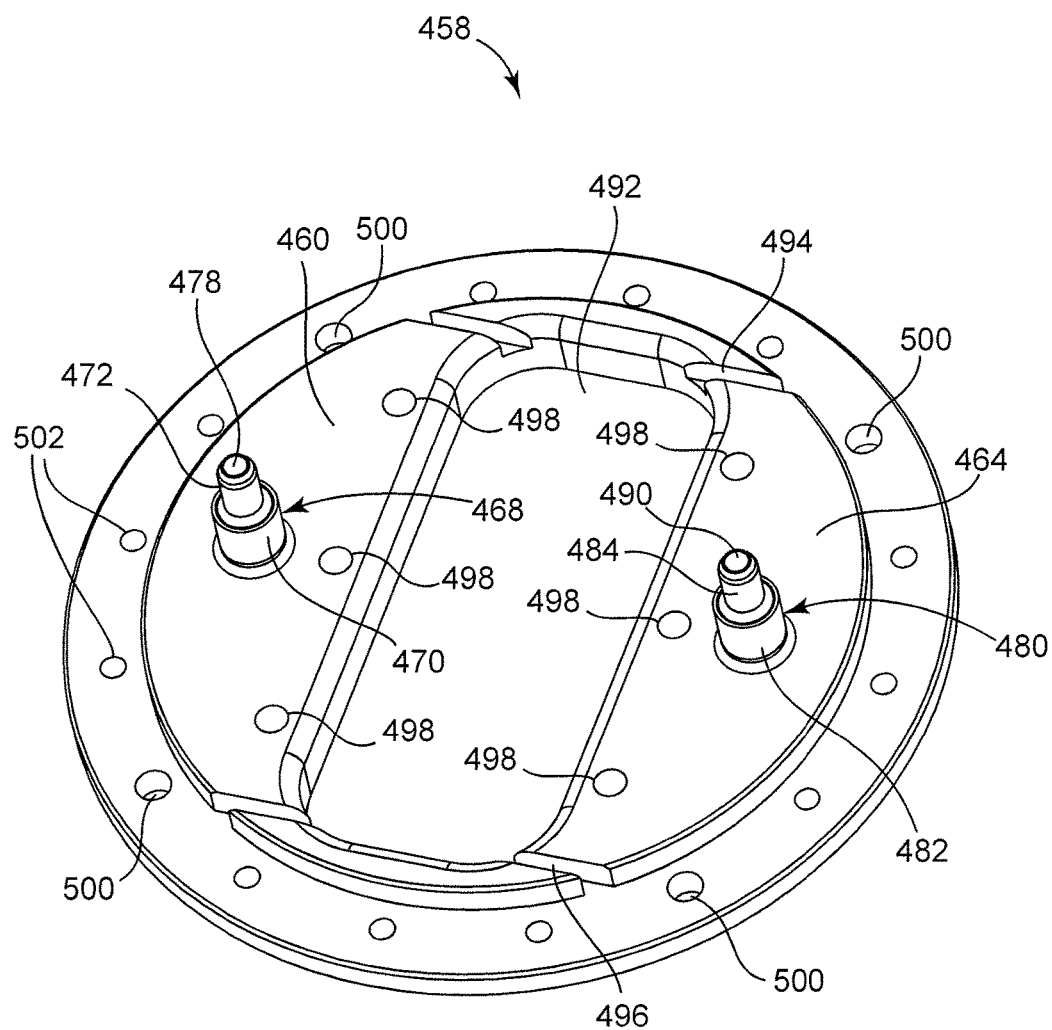
FIG. 31 is a perspective view of the cover used in the showerhead assembly of the barrier/dispense section of FIG. 2.
Figure 32:
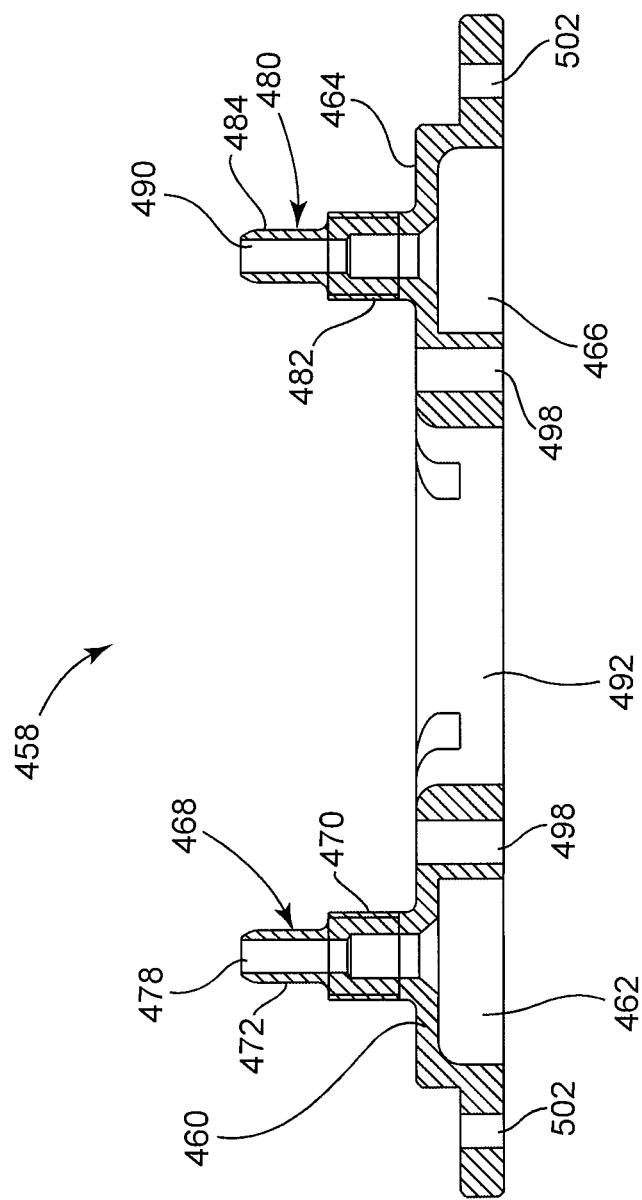
FIG. 32 is a side cross-section view of the base used in the showerhead assembly of the barrier/dispense section of FIG. 2.
Figure 33:
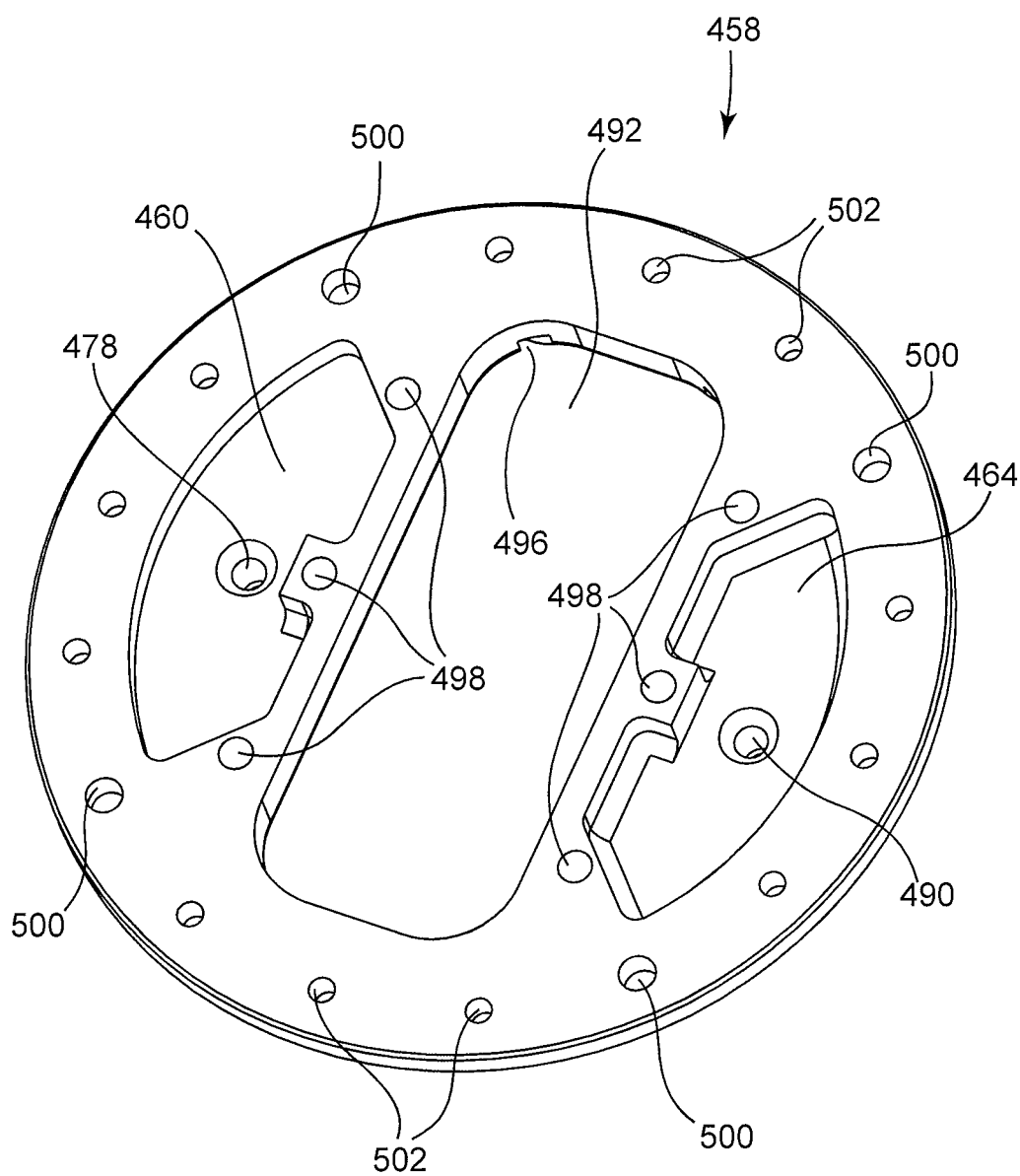
FIG. 33 is a bottom view of the cover used in the showerhead assembly of the barrier/dispense section of FIG. 2.
Figure 34:
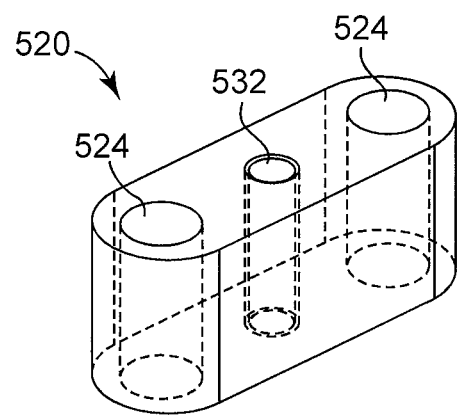
FIG. 34 is a perspective view with some features shown in phantom of the center dispense nozzle retainer used in the barrier/dispense section of FIG. 2.
Figure 35:
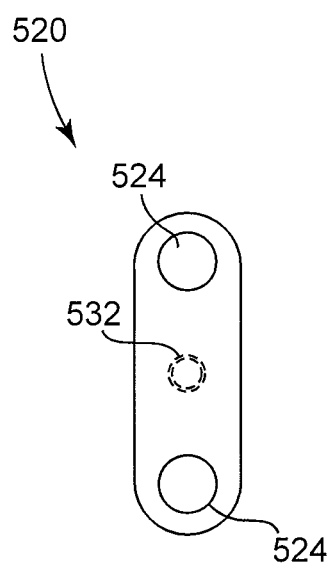
FIG. 35 is a top view of the center dispense nozzle retainer used in the barrier/dispense section of FIG. 2.
Figure 36:
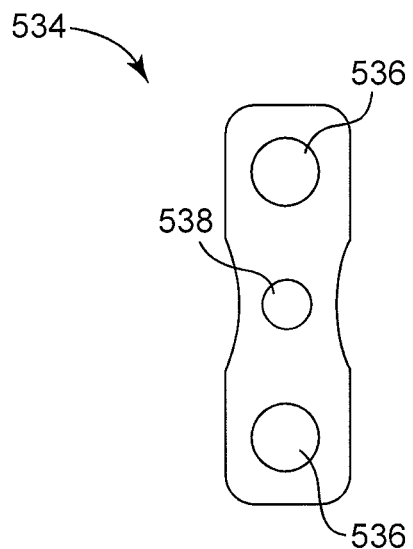
FIG. 36 is a top view of the retainer used to help clamp the center dispense nozzle retainer in FIGS. 34 and 35.

However, it has now been observed that the footprint of a spray upon the underlying workpiece is smaller than might be expected. Specifically, when liquid is atomized with a gas using a spraying mechanism such as spray bar 178, the on-workpiece footprint of the spray is smaller than the span of the nozzle array(s) from which the sprayed materials were dispensed. Thus, if the footprint of the nozzle openings merely span from the workpiece center to the outer periphery, the resultant spray may not actually effectively reach the center or the outer periphery, depending on spin speeds, exhaust flow rates, spraybar height above the workpiece and combinations thereof. The high velocity of the dispensed gas develops a lower pressure region due to the Bernoulli effect which causes the spray to angle inward as the spray moves toward the workpiece. The portions of the spray array at the ends of the spray get drawn inward as shown in FIGS. 20b and 20c. FIGS. 20a-20c illustrate the trajectory of spray 310, 320, and 330, respectively, with respect to workpieces 312, 322, and 332, respectively. Like workpiece 18, workpieces 312, 322, and 332, are typically a semiconductor wafer or other microelectronic substrate.

FIG. 20a shows an idealized situation in which a spray bar 308 dispenses a spray 310 onto underlying, spinning workpiece 312. The length of the footprint of the spray as it is dispensed matches the on-workpiece footprint of the spray. With the spray footprint as dispensed matching the workpiece 312 radius between center 316 and outer periphery 314, full radius coverage of the workpiece 312 is achieved. As the workpiece 312 spins about its center 316, the full surface of the workpiece 312 is uniformly treated. This idealized situation is generally representative of a mode of practice in which liquid material is dispensed onto workpiece 312 without atomization via impingement with a separate gas stream.

FIG. 20b schematically shows that the situation is different when a gas stream is used to atomize the liquid stream(s), particularly when the atomization is achieved via a collision between at least one gas stream and at least one liquid stream. In FIG. 20b, spray bar 318 dispenses atomized spray 320 onto underlying spinning workpiece 322. As dispensed, the spray footprint matches the radius of the workpiece 322 between the workpiece center 326 and the workpiece outer periphery 324. However, the footprint of the spray 320 is reduced by the time the spray 320 reaches workpiece 322. Due to the atomizing of the liquid stream(s) with at least one gas stream a Bernoulli effect is established that draws the outer atomized flow streams inward as shown in FIG. 20b. In an etching or particle removal process, for instance, the on-workpiece consequence of this effect is that the workpiece center or periphery may experience less etching or particle removal, as the case may be. The effect appears to be of a greater magnitude at the workpiece center than at the workpiece perimeter, but the effect is observable in both regions. With respect to the workpiece center 326, the spray 320 is not fully dispensed onto the workpiece center 326 due to the Bernoulli effect and the workpiece center 326 remains starved of spray 320 material because after the spray 320 material contacts spinning workpiece 322 the spray 320 material tends to flow radially outward away from the workpiece center 326 during the course of treatment. With respect to the workpiece outer periphery 324, the spray 320 is not fully dispensed onto the workpiece periphery 324 due to the Bernoulli effect yet the spinning of workpiece 322 causes mass flow of the dispensed spray 320 material to flow radially outward and treat the outer periphery 324 such that outer periphery 324 is not as starved overall as the workpiece center 326.

The present invention advantageously helps to overcome the Bernoulli effect by first recognizing the effect and then using a spray bar that dispenses a spray with a large enough footprint so that the reduced, on-workpiece footprint is still large enough to generally effectively treat the workpiece center region in a reasonably uniform manner with respect to other surface regions of the workpiece. The effect is easier to accommodate at the outer periphery for at least two reasons. First, the Bernoulli effect appears to have less of an impact upon process uniformity at the outer periphery. It is believed that the effect is lesser at the outer periphery at least partly because the general mass flow of dispensed liquid is radially outward across the spinning workpiece. Thus, the outer periphery is not as starved for treatment material as is the central region over the course of a treatment. Second, the spray footprint can extend well beyond the workpiece perimeter, subject to practical constraints of not wasting too much treatment material.

Generally, the amount of footprint "lost" as the spray travels toward the workpiece may be determined empirically. Then, enough extra nozzles can be added to the array so that the spray is still large enough to span the workpiece radius when the spray reaches the workpiece. For instance, if the spray loses about 10.5 mm on each end, adding 3 extra nozzle elements, or portions of nozzle elements, at one or both ends of the spray bar, preferably at least at the end overlying the workpiece center, on 3.5 mm centers would overcome the loss. According to one empirical methodology for evaluating the loss of spray footprint, a spray bar with a particular spray footprint can be used to subject a workpiece to a test treatment such as an etching treatment, a particle removal treatment, or the like. It is often convenient to begin this empirical analysis with a spray bar having a nozzle footprint that is positioned so that the nozzle footprint closely matches the workpiece center. That is, it is desirable that the most radially inboard nozzle opening directly overlies the workpiece center. It is also convenient that the nozzle footprint at least reach, or extend past the outer periphery of the workpiece. After the treatment, the treated workpiece can be analyzed to assess process performance as a function of distance from the center of the workpiece. If the Bernoulli effect is present, a distinct impairment of process performance will be observed in the workpiece region proximal to the workpiece center.

A number of strategies may be used to modify a spray bar when implementing this approach. According to one strategy, an array(s) of nozzles can be shifted along the radius of the workpiece 18 to help ensure that the footprint of the spray on the workpiece 18 includes at least the center of the workpiece 18.

In another strategy, extra nozzle(s) can be added to a nozzle array to extend its footprint. As schematically shown in FIG. 20c, extra nozzle(s) are added to spray bar 328 such that the extra nozzle(s) are positioned past the workpiece center 336 of workpiece 332 to help compensate for the Bernoulli effect. That is, as spray bar 328 dispenses spray 330 onto underlying workpiece 332, the on-workpiece spray footprint more closely matches the workpiece radius between the workpiece center 336 and the workpiece outer periphery 334. An example of including extra nozzle(s) involves including one or more extra spray elements to extend the spray bar footprint. When using the spray bar 178, this would involve adding three extra nozzle holes per element. One hole would be the gas dispense nozzle at the apex 184 of the groove 182, while two additional liquid dispense nozzle openings are added next to the additional gas opening on the adjacent faces 186. Another example of including extra nozzle(s) involves adding only one or more additional gas dispense nozzles to the nozzle array to extend its footprint. Another example of including extra nozzle(s) involves adding only one or more additional sets of liquid dispense nozzle openings to extend the nozzle footprint. The additional nozzle openings may be the same size or differently sized from the other nozzle openings of the spray bar.

Referring again to FIGS. 2-4 and 12-15, in one embodiment a nozzle array 234 at the apex 184 includes a row of nozzle openings that are 0.020 inches in diameter and that are spaced at 3.5 mm centers. The array of nozzles on the apex 184 of groove 182 desirably is slightly longer than the radius of the workpiece to help ensure that the footprint of the spray on the workpiece 18 matches the radius of workpiece 18, particularly at least at the center. For example, the total span of array 234 includes additional nozzle holes that extend past the center of the workpiece 18 on the inboard end 200 and optionally may include nozzle holes that extend beyond the periphery of the underlying workpiece 18.

In similar fashion, in one embodiment each of nozzle arrays on the adjacent faces 186 includes nozzle openings that correspond to the array of nozzles on the apex 184 to enable atomization and are 0.026 inches in diameter and that are spaced at 3.5 mm centers. The arrays 260 of nozzles are slightly longer than the radius of the workpiece to help ensure that the footprint of the spray on the workpiece 18 matches the radius of workpiece 18, particularly at least at the center of the workpiece. For example, the total span of each array 260 includes additional nozzle holes that extend past the center of the workpiece 18 on the inboard end 200 and optionally may include additional nozzle holes that extend beyond the periphery of the underlying workpiece 18.

In preferred embodiments, spray bar 178 fits into, but is a separate component from, barrier plate 102. This approach provides numerous advantages. Firstly, it allows each of these components to be made from different materials more suitable for the intended purposes of each component. For instance, in the case of spray bar 178, as well as other dispensing components of tool 10, dispensing components of tool 10 in the fluid delivery/wetted path, or at least surfaces thereof, preferably are formed from one or more fluoropolymers for high purity. These components include spray bar 178, the showerhead assembly 426, and at least the tubing of the center dispense nozzle assembly 518. Polytetrafluoroethylene (available under the tradename TEFLON from E.I. Du Pont de Nemours & Co.) has been found to be suitable. On the other hand, the barrier plate 102, or at least its lower surface 106, desirably is made from a hydrophilic material such as quartz or the like in order to optimize the cleaning and drying of the lower surface 106. Specifically, a hydrophilic surface such as quartz will tend to be more efficient to rinse and dry as compared to a hydrophobic surface in many instances.

Using separate spray bar and barrier plate components also allows better thermal isolation between the spray bar 178 and the barrier plate 102. When the spray bar and barrier plate are a single, integrated component, the whole unit has a relatively large thermal mass that can act as a heat sink when heated fluids are dispensed on the workpiece 18. The effect is a temperature drop between the fluid entering the spraybar and the relatively cooler fluid leaving at the outboard end of the spraybar due to heat loss to the thermal mass of the barrier plate. This temperature difference along the spraybar results in temperature non-uniformity of the materials dispensed on the workpiece. This can negatively affect the process uniformity on the workpiece and from workpiece to workpiece. However, when the spray bar 178 is a separate component as shown, the thermal mass is greatly reduced. Also, by fitting the spray bar 178 into pocket 124 of barrier plate 102 with only nozzle area of groove 182 exposed through slot 130, the area of the spray bar 178 exposed to the process chamber 16 is minimized and the spray bar 178 is thermally shielded by barrier plate 102 to a large extent. This approach thermally isolates spray bar 178 from workpiece 18 to a great extent, minimizing non-uniform thermal effects that could compromise process performance.

The use of the resilient bearing surfaces also accommodates the difference in thermal expansion between the spray bar 178 and the barrier plate 102 in those embodiments in which the two components are formed from different materials or operate at significantly different temperatures. The use of the resilient o-rings as bearing surfaces also minimizes surface contact between the spray bar 178 and the barrier plate 102. This helps to thermally isolate the spray bar 178, helping to counter thermal effects from heated fluid/chemical delivery from transferring heat to the barrier plate 102 and then, ultimately, to the workpiece 18.

Figure 17:
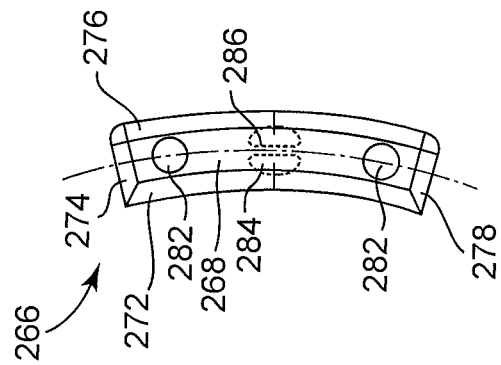
FIG. 17 is a top view of the retaining clamp used to hold the spray bar of FIG. 13 in the pocket of the barrier plate shown in FIG. 15, with some parts shown in phantom.
Figure 16:
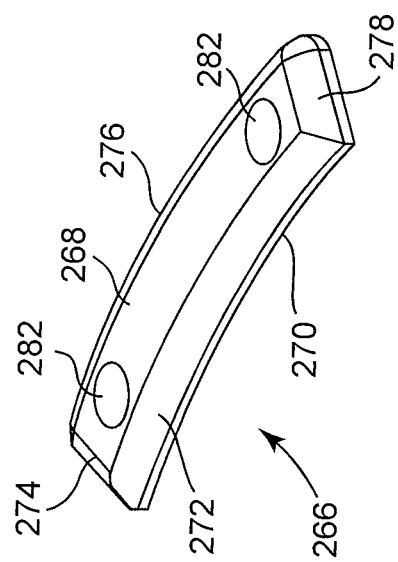
FIG. 16 is a perspective view of the retaining clamp used to hold the spray bar of FIG. 13 in the pocket of the barrier plate shown in FIG. 15.

The retainer plate 266 helps to secure spray bar 178 into pocket 124 of barrier plate 102. FIGS. 2, 16 and 17 show the retainer plate 266 in more detail. Retainer plate 266 includes top 268, bottom 270, and sides 272, 274, 276 and 278. Retainer plate 266 includes apertures 282 so that screws or other suitable fastening technique (not shown) can engage threaded bores 148 to secure retainer plate to barrier plate 102. The bottom 270 includes a pocket 284 having a tab 286. An o-ring (not shown) fits into the pocket 284. The o-ring is sized so that it is compressed to provide a resilient bearing surface between retainer plate 266 and spray bar 178 when retainer plate 266 clamps the spray bar 178 into position.

Figure 18:
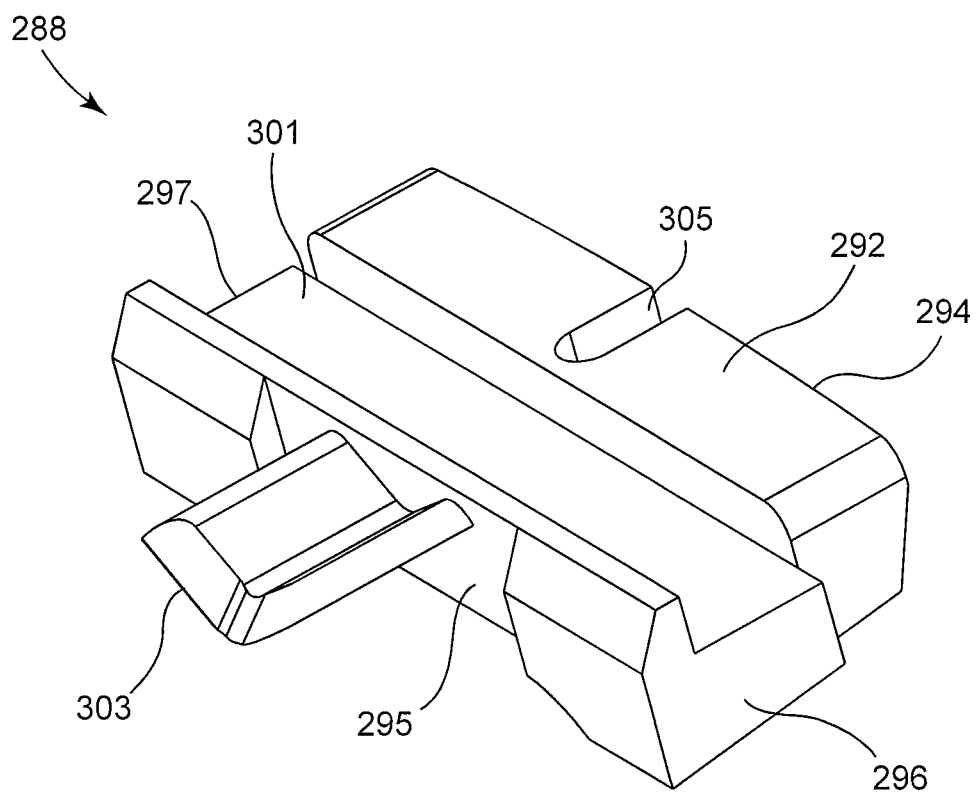
FIG. 18 is a perspective view of the filler piece used in the barrier dispense section of FIG. 2, looking toward the bottom of the filler piece.
Figure 19:
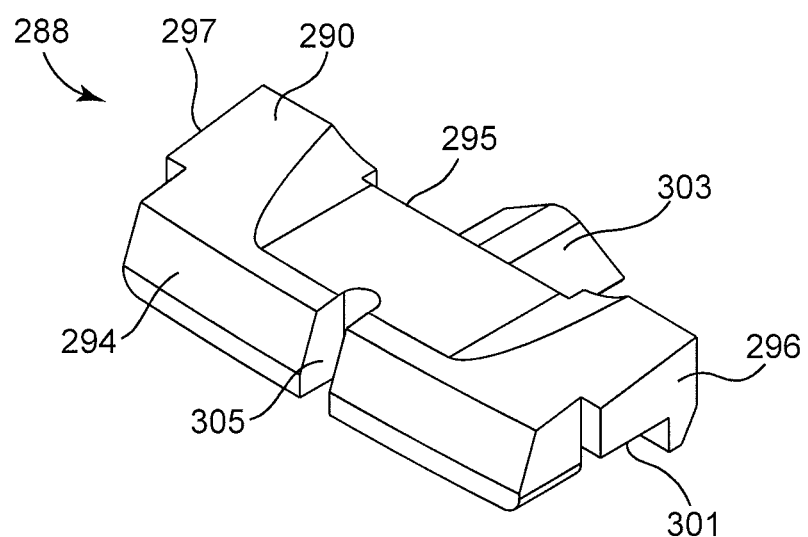
FIG. 19 is a perspective view of the filler piece used in the barrier dispense section of FIG. 2, looking toward the top of the filler piece.

Referring to FIGS. 2, 18, and 19, filler piece 288 is fitted in notch 166 between ends 162 and 164 of seal ring 160. Filler piece 288 includes top 290, bottom 292, and sides 294, 295, 296, and 297. Trough 301 is formed in bottom to form a pathway to interconnect trough 152 between ends 162 and 164. Filler piece 288 also includes tail 303 to fill a gap between spray bar 178 and barrier plate 102, preventing leakage there that might otherwise occur. Notch 305 provides stress relief, allowing filler piece 288 to conform and fit intimately with recess 299 of barrier plate 102. Filler piece 288 is held in place by spraybar 178 and seal ring 160.

Plumbing, air intake and the like may be fed through a central chimney pathway 103 (shown schematically in FIG. 1) of the barrier/dispense section 14. The chimney may be open in many modes of practice, even during processing. One issue, then, is to contain dispensed materials in process chamber 16, especially sprayed materials and gases, when the chimney path is in an open condition. One option is to make chimney pathway 103 sufficiently tall to achieve the desired degree of containment. However, this approach would require a relatively lengthy chimney. When tool 10 is integrated in a stacked fashion in a larger tool cluster (not shown), using vertical space more efficiently is an increasingly higher priority.

Accordingly, the present invention may implement one or more strategies that allow shorter length chimneys to be used while still achieving the desired degree of containment. According to one approach, a suitable gas flow (e.g., intake air or the like) is introduced into process chamber 16 through the chimney pathway 103 during at least a portion of processing. By using such a gas flow, better stacking efficiency among tool stations can be achieved because the chimney can be shorter.

A particularly preferred mode of practice involves providing the chimney pathway with a venturi-shaped contour. A venturi generally includes flaring ends at the inlet and outlet and a relatively narrow throat interposed between the inlet and outlet. The contour of the venturi desirably is generally smooth to promote smooth air flow and minimize turbulence. The venturi helps to accelerate the gas flow through the throat with a minimal pressure drop. The venturi provides excellent containment while allowing further reduction in chimney height as compared to an ordinary cylindrical pathway.

In an illustrative mode of incorporating a venturi into the chimney pathway 103, the chimney pathway 103 is provided with venturi features via the use of air intake flange 338. Air intake flange 338 is shown best in FIGS. 2-4 and 21-23. Air intake flange 338 includes body 340 top end 342, rounded rim 344 at top end 342, and bottom end 348. The underside of rounded rim 344 includes and annular trough 346 provided for weight savings. Each of inner wall 350 and outer wall 360 extends from top end 342 and bottom end 348. Outer wall 360 is faceted, rather than being parallel to inner wall 350 to provide access to mounting hardware and for weight savings.

Advantageously, the inner wall 350 is shaped to provide venturi-shaped passages 352 on each side of spray bar 178. Each of passages 352 includes a relatively narrow throat 354 in which the passage 352 is constricted and relatively broader, flaring ends 356 and 358. In use, flaring end 356 functions as an inlet through which one or more gases such as air, clean dry air, nitrogen, carbon dioxide, argon, isopropyl alcohol vapor, combinations of these and the like are drawn into air intake flange 338. Flaring end 358 functions as an outlet through which one or more gases is discharged downward into processing chamber 16. As gas flows through the venturi-shaped passages 352, the velocity increases as the passages constrict. As the flow rate increases, the pressure of the flowing gas decreases. This means that the pressure in the venturi is relatively higher near flaring inlet end 356 and relatively lower at the throat 354. The pressure through the venturi decreases with increasing velocity. Thus, when the flow rate through the venturi is high enough, the relatively higher pressure at the inlet end 356 is high enough to help contain processing materials in the processing chamber 16. In short, the venturi-shaped passages 352 function as a containment system in situations in which treatment materials, which may be liquid, solid, or gas, must be contained in a chamber that requires an opening for the introduction of processing gases.

For example, during a typical process, make-up air or other gas enters the process chamber through the venturi-shaped passages 352. The incoming air or gas accelerates as it passes through the throats of the passages 352. The high velocity air or gas moving through the throat 354 and into the chamber 16 prevents mist from escaping back up air intake flange 338. In contrast, in an air intake passage lacking a throat constriction or sufficient height, process chamber mist can escape, causing safety concerns, leading to contamination, reduced process performance due to loss of processing material and the like.

In one illustrative operation condition, substantially complete mist and steam containment was achieved using 50 cfm inlet air. This was achieved using 3 inches of exhaust vacuum. In this test, the workpiece was spun on its chuck at 250 rpm while being sprayed with 1 liter per minute deionized water at 65° C. The width of each of the venturi throats was 1.12 inches, while each corresponding inlet and outlet had a width of 1.75 inches. The length of each of the venturi-shaped passages was three inches.

Still referring mainly to FIGS. 2-4 and 21-23 in discussing air intake flange 338, the bottom portion of outer wall 360 is shaped so that air outlet flange 368 fits onto inner periphery 110 of barrier plate 102. The bottom portion 370 of inner wall 350 is shaped to provide a smooth transition from inner wall portion 370 to the lower surface 106 of barrier plate 102.

Peripheral flange 372 surrounds body 340 of air intake flange 338 proximal to bottom end 348. Peripheral flange 372 reinforces body 340. Peripheral flange 372 also includes apertures 374 so that air intake flange 338 can be secured to threaded bores 142 of barrier plate 102 using screws or the like. Standoff supports 380 threadably engage threaded bores 378 formed in rounded rim 344. Standoff supports 380, which include threaded bores (not shown), help to support and secure showerhead assembly 426, described further below.

Inner wall 350 of air intake flange 338 also includes opposed pockets 362 and 366. These pockets are sized to hold showerhead spacer 382, described further below. The wall of pocket 362 includes a trio of holes 364. One, two, or all of these holes 364 may be used to lead plumbing components, e.g., tubing, through flange 338.

In addition to spraying capabilities, dispense assembly 100 further incorporates further dispensing capabilities to dispense one or more treatment fluids showerhead-style generally downward toward workpiece 18. This approach is especially useful for dispensing uniform flows of one or more gases and/or vapors into processing chamber 16. In preferred embodiments, this capability is provided by a dispensing structure such as showerhead dispense member 426. Showerhead spacer 382 and standoff supports 380 help to mount and support showerhead dispense member 426. For purposes of illustration, showerhead dispense member 426 is fed by two supply feeds, which may be the same or independent, thus allowing two different treatment materials to be dispensed into processing chamber 16 at the same time. Of course, other embodiments may include only a single supply feed or three or more feeds, as desired.

In more detail, and as seen best in FIGS. 2-4 and 24-27, showerhead spacer 382 includes top 384, bottom 386, floor 408, and sides 390, 396, 400, and 404. Side 390 includes a trio of holes 392 that respectively match up with holes 364 through air intake flange 338. In use, the sets of holes 364 and 392 may be used to lead plumbing components (not shown) through showerhead spacer 382 and air intake flange 338. One or more of these sets of holes 364 and 392 may be used for this purpose. For example, in one illustrative embodiment, a tubing (not shown) coupled to an exhaust source (not shown) is fed downward through the interior of showerhead spacer 382 and then fed outward through spacer 382 and air intake flange 338 through one set of holes 392 and 364, respectively. Outside the air intake flange 338, the tubing is joined to three other tubes that are respectively led to the egress holes 174 provided in seal ring 160. The tubing is inserted far enough into holes 174 to pull an aspirating vacuum in trough 152. Additional tubing (not shown) is similarly fed downward through the interior of showerhead spacer 382 and then fed outward through spacer 382 and air intake flange 338 through another set of holes 392 and 364, respectively. Outside the air intake flange 338, the additional tubing is joined to three other tubes that are respectively led to the egress holes 176 provided in seal ring 160. The tubing is inserted far enough into holes 176 to remove liquid material collected in trough 152.

Figure 37:
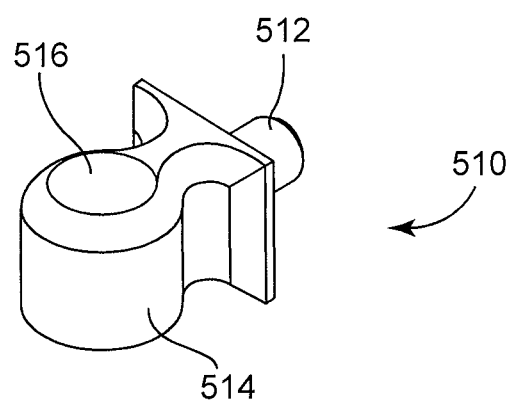
FIG. 37 is a perspective view of a rinse tube holder used in the barrier dispense section of FIG. 2.

Weight saving holes 394 are formed in the top of sides 390 and 396. Sides 400 and 404 each include respective trios of holes 402. Holes 402 are used to hold rinse tube holders 510. As shown in FIG. 37, each rinse tube holder 510 includes a neck 512, body 514, and aperture 516. Necks 512 engage holes 402, preferably with a threadable engagement (thread features not shown). Rinse tubes 504 are led through apertures 516 downward into process chamber 16. The ends of these tubes are positioned at a height so that nozzles 508 at the ends of the tubes can spray generally horizontally to rinse or otherwise treat the lower surface 106 of barrier plate 102.

Advantageously, the rinse tubes 504 incorporate the ability to rinse and dry the bottom surface 106 of barrier plate 102 to help keep the barrier plate 102 clean and dry. In a typical mode of practice, the cleaning and drying of barrier plate 102 occurs with the workpiece 18 present and at least partially co-extensive with the rinsing and drying of workpiece 18 in order to minimize cycle time. It can be difficult to remove liquid droplets near the outer periphery 112 of the lower surface 106. The aspirator system incorporated into the barrier plate 102 helps avoid this difficulty.

Floor 408 includes hole 410 so that screw 138 can engage threaded bore 136 in raised boss 134 to secure showerhead spacer 382 to barrier plate 102. Floor 408 includes hole 412 for securing center dispense componentry described further below. Holes 414 allow supply tubing to be led to the center dispense componentry. Holes 416 and 418 fit over fluid inlet members 216 and 240, respectively. O-rings (not shown) fit into cavities 419 between showerhead spacer 382 and spray bar 178 and between showerhead spacer 382 and barrier plate 102.

Showerhead spacer 382 is installed so that bottom ends 420 and floor 408 are supported upon the top surfaces of spray bar 178, while legs 422 fit around arm 118 of barrier plate 102. The outer surfaces 424 of legs 422 are shaped to match the side faces 126 of pocket 124.

Showerhead dispense member 426 is mounted between the standoffs 380 and the "moveable support member" as described in Assignee's Co-Pending Applications Nos. 1 and 2. Showerhead dispense member 426 generally includes bottom 428 and cover 458. Bottom 428 includes generally circular floor panel 430 having a generally rectilinear central aperture 432 and flange 434 projecting downward from the rim of central aperture 432. The flange 434 and aperture 432 are sized to fit over underlying and support showerhead spacer 382. The central aperture 432 provides a convenient pathway for leading plumbing components to the central dispense nozzle assembly 518 and spray bar 178.

Floor panel 430 includes several aperture features that facilitate the functionality and mounting of showerhead dispense member 426. On each side of central aperture 432, floor panel 430 includes apertures 444 which help support and lead rinse tubes 504 to process chamber 16. Relatively large through apertures 446 around the periphery of bottom 428 are used to mount bottom 428 to standoff supports 380 using screws or the like. Relatively smaller, threaded bores 448 allow the cover 458 and moveable member (not shown, but described in Assignee's Co-Pending Application) to be mounted to bottom 428 using screws or the like.

Floor panel 430 of bottom 428 includes first region 450 to one side of central aperture 432 and second region 454 positioned on the other side of central aperture 432. First region 450 includes an array of nozzle openings 452, while second region 454 includes a second array of nozzle openings 456.

Cover 458 generally includes raised panels 460 and 464. First and second chambers 462 and 466 are formed between panels 460 and 464, on the one hand, and floor panel 430 on the other. Central aperture 492 overlies central aperture 432 of bottom 428, providing a convenient pathway for leading plumbing components to center dispense nozzle assembly 518 and spray bar 178. On top of cover 458, notches 494 and 496 are used for drainage in case of a leak.

One or more treatment materials, typically gases and/or vapors, may be supplied to showerhead dispense member 426 and are introduced into showerhead dispense member 426 via fluid inlet members 468 and/or 480. Fluid inlet member 468 includes threaded base 470 and flare coupling 472. A supply tube (not shown) is fluidly coupled to flare coupling 472 and held in place via a retainer nut (not shown) that threadably engages threaded base 470. Conduit 478 opens into chamber 462. Fluid inlet member 480 includes threaded base 482 and flare coupling 484. A supply tube (not shown) is fluidly coupled to flare coupling 484 and held in place via a retainer nut (not shown) that threadably engages threaded base 482. Conduit 490 opens into chamber 466.

On each side of central aperture 492, apertures 498, which directly overlie apertures 444, help support and lead rinse tubes 504 to process chamber 16. Relatively large through apertures 500 around the periphery of cover 458 overlie similar apertures 446 on bottom 428 and similarly are used to mount cover 458 to standoff supports 380 using screws or the like. Relatively smaller, through bores 502 overlie threaded bores 448 and allow the cover 458 and moveable member to be mounted to bottom 428 using screws or the like.

In use, one or more treatment fluids, especially one or more flows of gas(es), are supplied to showerhead dispense member 426 via one or two supply tubes (not shown). The treatment fluids supplied to each tube may be the same or different. The treatment fluids are introduced into chambers 462 and 466 via conduits 478 and 490, respectively. The pressure of the treatment fluid(s) within chambers 462 and 466 is generally equalized so that the flow through the nozzles 452 and 456 is uniform. Desirably, the pressure differential of the fluid(s) within chambers 462 and 466 upstream from the showerhead nozzles is desirably less than pressure drop through the nozzles 452 and 456 themselves in accordance with conventional practices to promote such uniform flow. When dispensed through the nozzles 452 and 456, the dispensed fluid(s) generally flow towards process chamber 16 and workpiece 18 through the venturi shaped pathways 352. Dispense assembly 100 further incorporates dispensing capabilities to dispense one or more treatment fluids generally onto the center of the underlying workpiece 18. The treatment fluids may be dispensed serially, simultaneously, in overlapping fashion, and/or the like. In preferred embodiments, this capability is provided by a dispensing structure such as central dispense nozzle assembly 518. For purposes of illustration, central dispense nozzle assembly 518 as shown includes two independent nozzles allowing two different treatment materials to be dispensed onto workpiece 18 at the same time. Of course, other embodiments may include only a single dispensing nozzle or three or more nozzles, as desired. Also, the same treatment material could be dispensed through both nozzles.

In more detail, as shown in FIGS. 2-4, 34, and 35, central dispense nozzle assembly 518 generally includes nozzle retainer 520 fitted with nozzle tubes 522 in apertures 524. Tubes 522 include flare couplings 526 seated against the top of nozzle retainer 520. Supply tubes 528 are coupled to the flare couplings 526 and held in place by retaining nuts 530. The bottom ends of the tubes 522 project downward below nozzle retainer 520 and are generally aimed at the center of the underlying workpiece 18. Nozzle retainer 520 fits into pocket 204 of spray bar 178. Screw 540 fits into threaded bore 532 of nozzle retainer 520.

Figure 3:
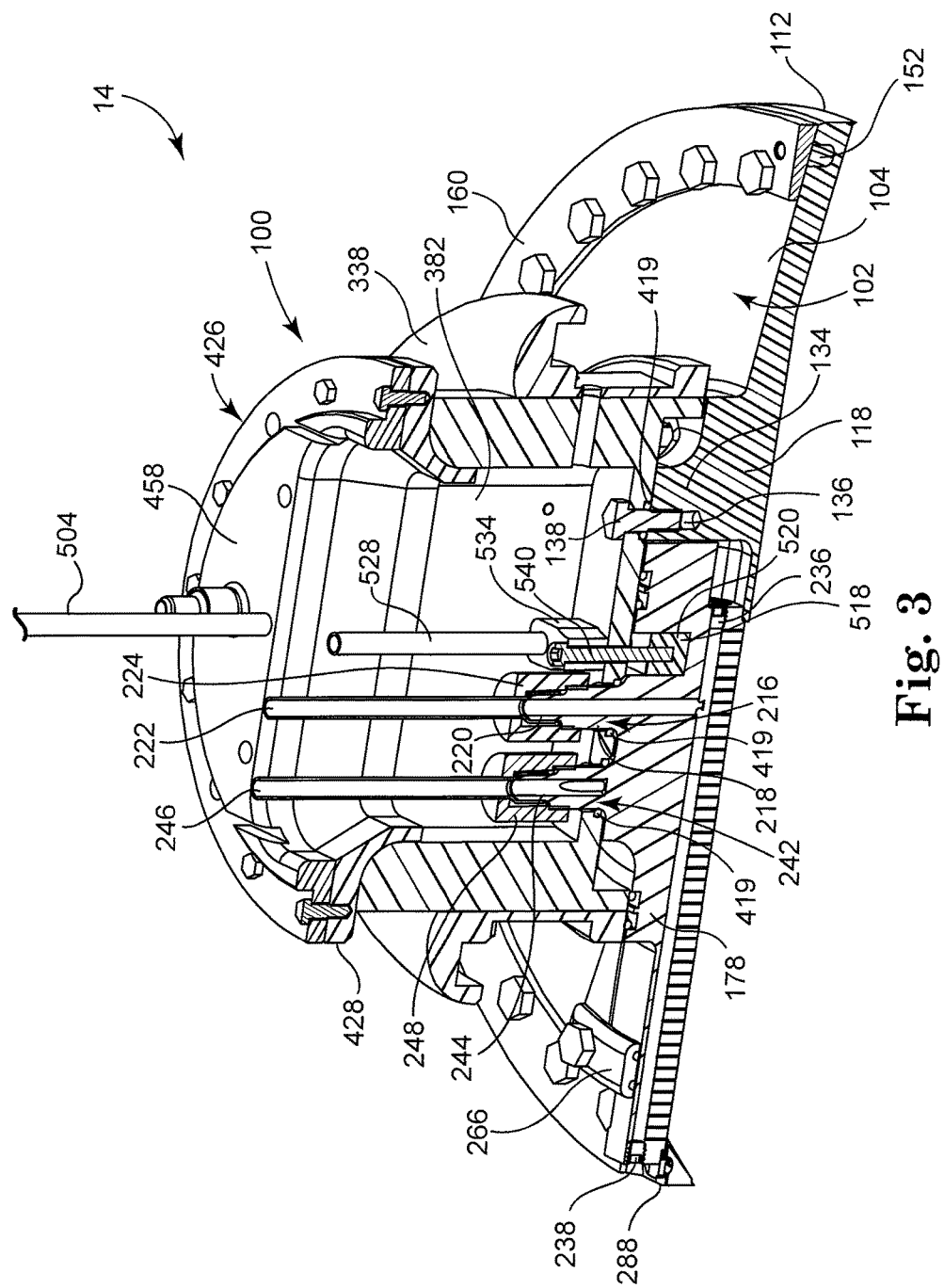
FIG. 3 is a perspective view, with some features shown in cross-section, of the barrier/dispense section shown schematically in FIG. 1.
Figure 4:
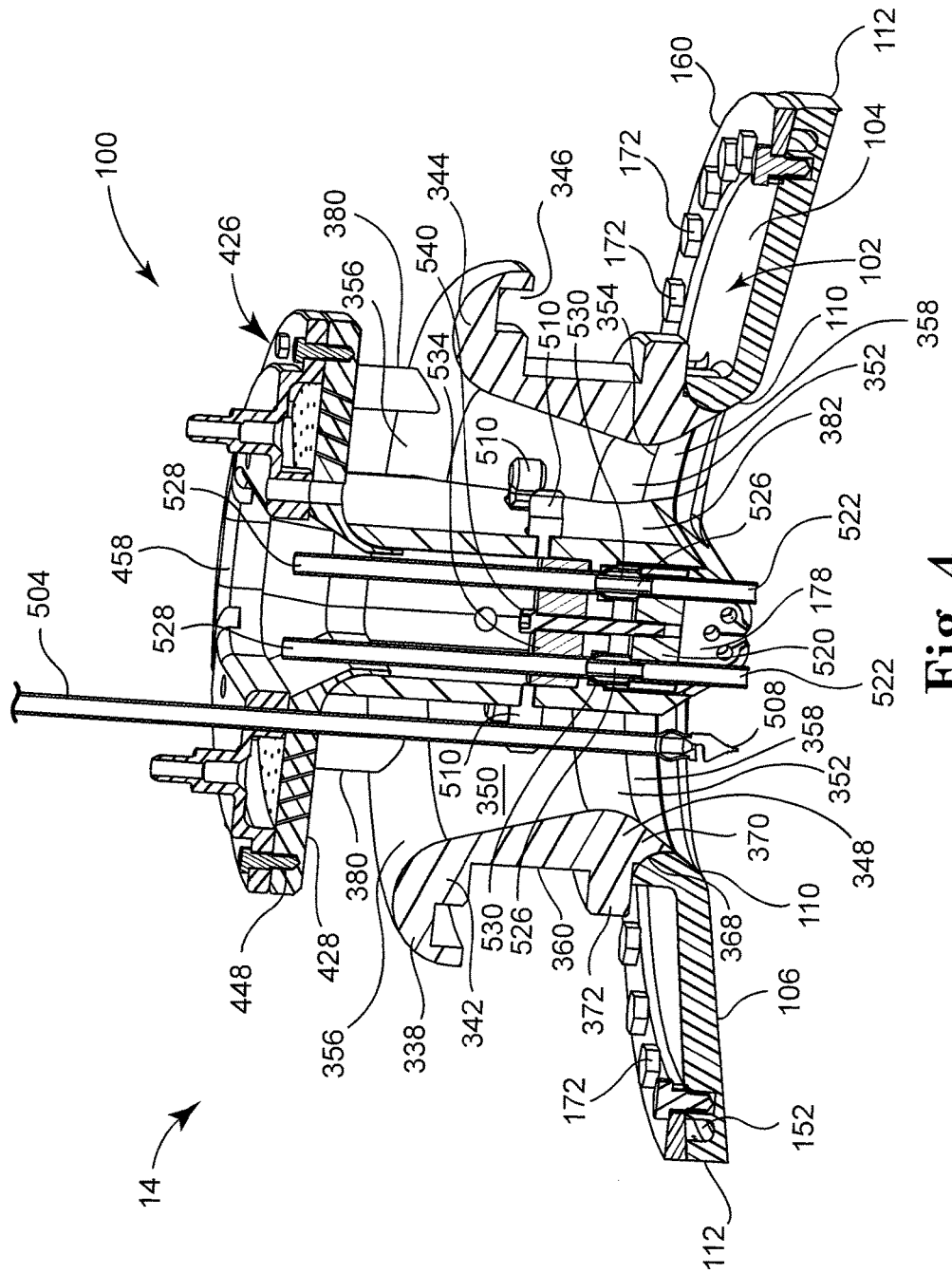
FIG. 4 is a perspective view, with some features shown in cross-section, of the barrier/dispense section shown schematically in FIG. 1.
Figure 5:
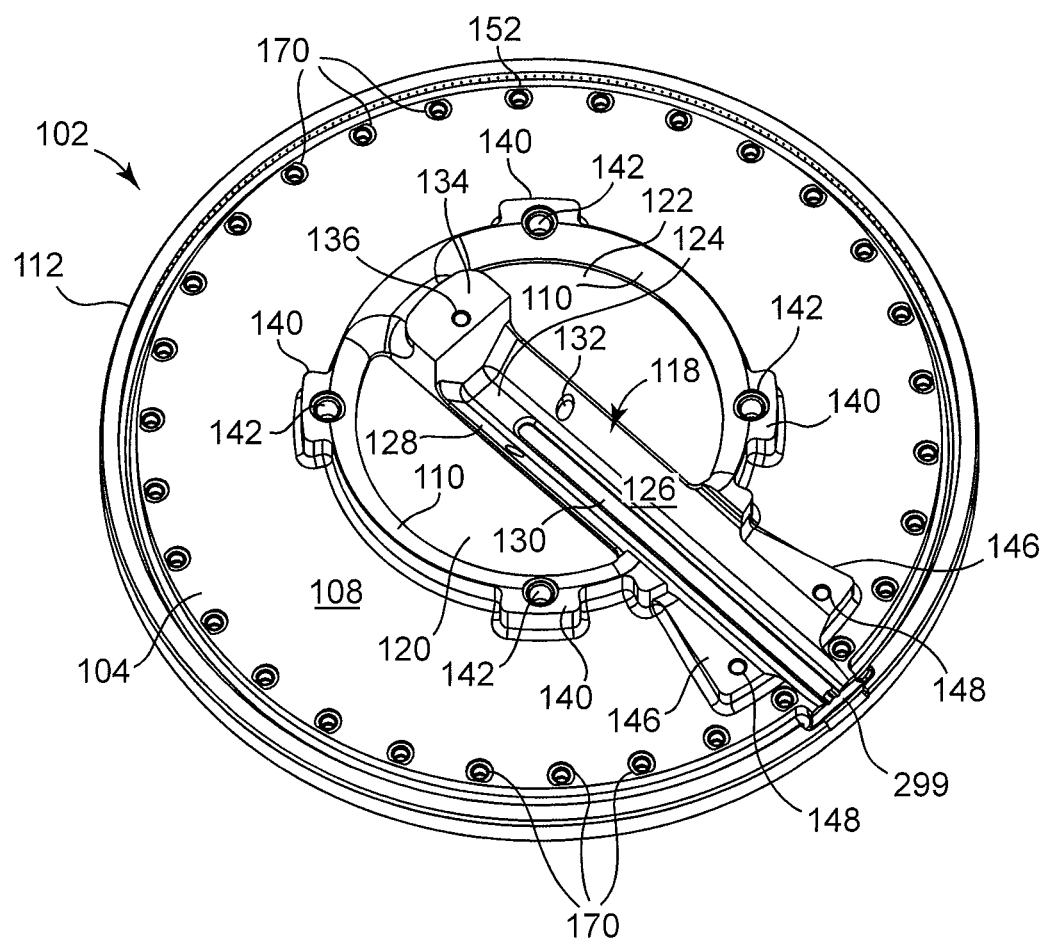
FIG. 5 is a perspective view of the barrier plate used in the barrier/dispense section of FIG. 2, looking toward the top of the barrier plate.

As shown in FIGS. 2-4, retainer 534 and screw 540 are used to help clamp nozzle retainer 520 securely in place. As shown in FIGS. 2-4 and 36, the retainer 534 includes apertures 536 that fit over and support the supply tubes 528. Aperture 538 of retainer 534 fits the screw 540.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of treating a microelectronic workpiece, comprising the steps of:
   a) providing a processing chamber in which the workpiece is positioned during a treatment, and a chuck positioned in the processing chamber for holding and supporting the workpiece;
   b) providing a source of gas;
   c) providing a source of a liquid;
   d) providing a spraying mechanism comprising a nozzle body comprising at least a first linear array of nozzles through which a gas is dispensed and at least a second linear array of nozzles through which a liquid is dispensed, wherein the source of the gas is in fluid communication with the first linear array of nozzles, wherein the source of the liquid is in fluid communication with the second linear array of nozzles, wherein each nozzle of the first and second linear arrays comprises a nozzle channel and a nozzle outlet;
   e) causing a gas stream to be dispensed from the first linear array of nozzles; and
   f) causing a liquid stream to be dispensed from the second linear array of nozzles;
   wherein more than one nozzle from the first linear array is configured and directionally positioned in an angled manner relative to a corresponding nozzle of the second linear array to cause dispensed gas and liquid to atomizingly collide in an open space external to the first and second linear arrays of nozzles to provide an atomized liquid spray that contacts the workpiece, wherein the source of the gas and the source of the liquid are each at a pressure to cause gas dispensed from the first linear array of nozzles and liquid dispensed from the second linear array of nozzles to atomizingly collide in an open space external to the first and second linear arrays of nozzles to provide an atomized liquid spray that contacts the workpiece, wherein at least one of the first and second arrays of nozzles has a nozzle footprint that extends past the center of the workpiece in a manner effective to provide the atomized liquid spray with an on-workpiece footprint that spans from the workpiece center at least partially to the outer periphery of the workpiece, wherein the atomized liquid spray has a span that is less than the span of the nozzle footprint of said at least one of the first and second arrays of nozzles that correspond to the nozzles that provide the atomized liquid spray.

2. The method of claim 1, wherein the method of treating comprises an etching treatment.

3. The method of claim 1, wherein the method of treating comprises a particle removal treatment.

4. The method of claim 1, wherein the on-workpiece footprint of the spray corresponds to the radius of the workpiece.

5. The method of claim 1, wherein the first and second linear arrays of nozzles have a nozzle footprint that extends past the center of the workpiece in a manner effective to provide the spray with an on-workpiece footprint that spans from the workpiece center at least partially to the outer periphery of the workpiece.

6. The method of claim 1, wherein the first and second linear arrays of nozzles have a nozzle footprint that extends from the outer periphery of the workpiece to past the center of the workpiece.

7. The method of claim 1, further comprising a third linear array of nozzles through which a liquid is dispensed, wherein said first, second, and third linear arrays of nozzles are positioned relative to each other in a manner effective to cause dispensed gas and liquid to atomizingly collide in an open space external to the first, second, and third linear arrays of nozzles to provide a spray that contacts the workpiece.

8. The method of claim 7, wherein the first, second, and third linear arrays of nozzles have a nozzle footprint that extends past the center of the workpiece in a manner effective to provide the spray with an on-workpiece footprint that spans from the workpiece center at least partially to the outer periphery of the workpiece.

9. The method of claim 7, wherein the first, second, and third linear arrays of nozzles have a nozzle footprint that extends from the outer periphery of the workpiece to past the center of the workpiece.

10. The method of claim 7, wherein the first, second, and third linear arrays of nozzles have a nozzle footprint that extends from beyond the outer periphery of the workpiece to past the center of the workpiece.

11. The method of claim 1, wherein the first and second linear arrays of nozzles have a nozzle footprint that extends from beyond the outer periphery of the workpiece to past the center of the workpiece.

* * * * *